United States Patent
Yang et al.

(10) Patent No.: US 8,765,551 B2
(45) Date of Patent: Jul. 1, 2014

(54) NON-VOLATILE MEMORY DEVICE HAVING VERTICAL STRUCTURE AND METHOD OF MANUFACTURING THE SAME

(71) Applicants: Jun-youl Yang, Seoul (KR); Dae-hong Eom, Hwaseong-si (KR); Byoung-moon Yoon, Suwon-si (KR); Kyung-hyun Kim, Seoul (KW); Se-ho Cha, Goyang-si (KR)

(72) Inventors: Jun-youl Yang, Seoul (KR); Dae-hong Eom, Hwaseong-si (KR); Byoung-moon Yoon, Suwon-si (KR); Kyung-hyun Kim, Seoul (KW); Se-ho Cha, Goyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/729,856

(22) Filed: Dec. 28, 2012

(65) Prior Publication Data
US 2013/0171788 A1 Jul. 4, 2013

(30) Foreign Application Priority Data
Dec. 30, 2011 (KR) .................. 10-2011-0147419

(51) Int. Cl.
*H01L 21/336* (2006.01)

(52) U.S. Cl.
USPC ..... 438/257; 438/201; 438/211; 257/E21.179

(58) Field of Classification Search
USPC .................. 438/201, 211–212, 257, 593; 257/E21.179, E21.422, E21.68
See application file for complete search history.

(56) References Cited

U.S. PATENT DOCUMENTS

| | | | |
|---|---|---|---|
| 2011/0080766 A1 | 4/2011 | Chang et al. | |
| 2011/0081757 A1 | 4/2011 | Juengling | |
| 2011/0303971 A1* | 12/2011 | Lee et al. | 257/324 |

FOREIGN PATENT DOCUMENTS

| | | |
|---|---|---|
| JP | 2009224466 A | 10/2009 |
| JP | 2009277770 A | 11/2009 |
| KR | 20030058603 A | 7/2003 |
| KR | 20050002520 A | 1/2005 |

* cited by examiner

*Primary Examiner* — Thanhha Pham
(74) *Attorney, Agent, or Firm* — Harness, Dickey & Pierce, P.L.C.

(57) ABSTRACT

According to an example embodiment, a non-volatile memory device includes a semiconductor layer pattern on a substrate, a plurality of gate patterns and a plurality of interlayer insulating layer patterns that are alternately stacked along a side wall of the semiconductor layer pattern, and a storage structure between the plurality of gate patterns and the semiconductor layer pattern. The semiconductor layer pattern extends in a vertical direction from the substrate. The gate patterns are recessed in a direction from a side wall of the interlayer insulating layer patterns opposing the side wall of the semiconductor layer pattern. A recessed surface of the gate patterns may be formed to be vertical to a surface of the substrate.

21 Claims, 20 Drawing Sheets

NON-VOLATILE MEMORY DEVICE HAVING VERTICAL STRUCTURE AND METHOD OF MANUFACTURING THE SAME

CROSS-REFERENCE TO RELATED APPLICATIONS

This application claims priority under 35 U.S.C. §119 to Korean Patent Application No. 10-2011-0147419, filed on Dec. 30, 2011, in the Korean Intellectual Property Office, the disclosure of which is incorporated herein in its entirety by reference.

BACKGROUND

Some example embodiments of inventive concepts relate to a non-volatile memory device and/or a method of manufacturing the same, and more particularly, to a non-volatile memory device having a vertical structure and/or a method of manufacturing the same.

As the size of electronic products gradually reduces, higher capacity data processing may be desired. Accordingly, an integration degree of semiconductor memory devices used in electronic products may be increased. A non-volatile memory device having a vertical structure instead of a planar transistor structure is one method that has been suggested for increasing the integration degree of semiconductor memory devices.

SUMMARY

Some example embodiments of inventive concepts relate to a non-volatile memory device having a vertical structure, with a higher integration degree and improved reliability.

Other example embodiments of inventive concepts relate to a method of manufacturing a non-volatile memory device having a vertical structure with a higher integration degree and improved reliability.

According to an example embodiment of inventive concepts, a non-volatile memory device having a vertical structure, includes: a semiconductor layer pattern on a substrate and extending in a vertical direction; a plurality of gate patterns and a plurality of interlayer insulating layer patterns that are alternately stacked along a side wall of the semiconductor layer pattern; and a storage structure between the plurality of gate patterns and the semiconductor layer patterns. The plurality of gate patterns are recessed in a direction from a side wall of the interlayer insulating layer patterns opposing the side wall of the semiconductor layer pattern, to the semiconductor layer pattern.

The plurality of gate patterns may include a barrier layer pattern and a conductive layer pattern on the barrier layer pattern.

A recessed depth of the barrier layer pattern in the direction from the side wall of the interlayer insulating layer patterns to the semiconductor layer pattern may be greater than a recessed depth of the conductive layer pattern from the side wall of the plurality of interlayer insulating layer patterns to the side wall of the semiconductor layer pattern.

A recessed depth of the barrier layer pattern may be equal to a recessed depth of the conductive layer pattern in the direction from the side wall of the plurality interlayer insulating layer patterns to the side wall of semiconductor layer pattern.

The storage structure may extend continuously between the plurality of interlayer insulating layer pattern and the plurality of gate patterns.

The storage structure may include a tunnel insulating layer, a charge storage layer, and a blocking insulating layer that are sequentially disposed from the side wall of the semiconductor layer pattern. The blocking insulating layer may be recessed in a direction from the side wall of the interlayer insulating layer patterns to the sidewall of semiconductor layer pattern.

According to another example embodiment of inventive concepts, a method of manufacturing a non-volatile memory device having a vertical structure includes: stacking a plurality of sacrificial layers and a plurality of interlayer insulating layers alternately on a substrate; forming a stacking structure by etching a first portion of the plurality of sacrificial layers and the interlayer insulating layers to form a plurality of sacrificial layer patterns and a plurality of interlayer insulating layer patterns that define first openings in the stacking structure that expose an upper portion of the substrate; forming semiconductor layer patterns in the first openings of the stacking structure; etching a second portion of the stacking structure to define a second opening in the stacking structure that is between the semiconductor layer patterns; etching the plurality of sacrificial layer patterns to define a plurality of rib grooves; and forming a plurality of gate patterns on the semiconductor layer patterns in the rib grooves. The plurality of gate patterns may be recessed in the direction from a side wall of the plurality of interlayer insulating layer patterns to the semiconductor layer patterns.

A recessed surface of the plurality of gate patterns may be vertical to a surface of the substrate.

A storage structure may be formed on the semiconductor layer patterns in the plurality of rib grooves. The forming of the gate patterns may include: forming a barrier layer on the storage structure in the plurality of rib grooves; forming a conductive layer that fills the rib grooves on the barrier layer; recessing the conductive layer and the barrier layer into the rib grooves by etching the conductive layer and the barrier layer in a first etching process; and forming a conductive layer pattern and a barrier layer pattern by etching the recessed conductive layer and the recessed barrier layer to recess the conductive layer and barrier layer into the rib grooves in a second etching process.

In the second etching process, a recessed surface of the gate pattern may be formed to be vertical to a surface of the substrate.

In the second etching process, the barrier layer pattern and the conductive layer pattern may be recessed at different recess depths in a direction from the side wall of the interlayer insulating layer patterns to the semiconductor layer patterns.

The second etching process may be performed while adjusting an etching selectivity between the recessed conductive layer and the recessed barrier layer but increasing an etching speed of the barrier layer.

The storage structure may include a tunnel insulating layer, a charge storage layer, and a blocking insulating layer disposed sequentially from the side wall of the semiconductor layer pattern, and the storage structure may be continuously extended between the interlayer insulating layer patterns and the gate patterns along the gate patterns.

In the second etching process, the blocking insulating layer may be recessed in the direction from a side wall of the interlayer insulating layer patterns to the semiconductor layer patterns. The method may further include etching the blocking insulating layer after performing the first etching process.

According to yet another example embodiment of inventive concepts, a method of manufacturing a non-volatile memory device may include forming at least one stacked stricture on a substrate, and forming a bit line on the at least one stacked structure. Each stacked structure may include a plurality of interlayer insulating layers extending a first distance from at least one sidewall of the semiconductor layer. The plurality of interlayer insulating layers are spaced apart to define grooves that expose a part of the at least one sidewall of the semiconductor layer. Each stacked structure further includes a storage layer in the grooves defined by the plurality of interlayer insulating layers, and a plurality of gate electrodes contacting the storage layer in the grooves defined by the plurality of interlayer insulating layers. The plurality of gate electrodes extend a second distance from the at least one sidewall of the semiconductor layer. The second distance is less than the first distance The forming at least one stacked structure may include forming the plurality of gate electrodes by forming a barrier layer over the storage layer in the grooves defined by the plurality of interlayer insulating layers, forming a conductive layer on the barrier layer that fills the grooves defined by the plurality of interlayer insulating layers, and recessing at least one of the conductive layer and the barrier layer to extend the second distance from the at least one sidewall of the semiconductor layer.

The storage structure may include a tunnel insulating layer, a charge storage layer, and a blocking insulating layer between the plurality of interlayer insulating layers and the barrier layer. The recessing at least one of the conductive layer and the barrier layer may include performing a first etching process to partially remove the barrier layer and the conductive layer in a direction from a sidewall of the plurality of interlayer insulating layers to the semiconductor layer, removing a portion of the blocking insulating layer from in between a tail part of a remaining portion of the barrier layer and the plurality of interlayer insulating layer, and performing a second etching process to remove the tail part of the remaining portion of the barrier layer and partially remove a remaining portion of the conductive layer.

An etching selectivity of the tail part of the remaining portion of the barrier layer with respect to the remaining portion of the conductive layer may be about 6 to 10 in the second etching process.

The method may include forming a plurality of the stacked structures that are spaced apart on the substrate, and the method may further include forming an isolation pattern between the plurality of stacked structures.

BRIEF DESCRIPTION OF THE DRAWINGS

The foregoing and other features of inventive concepts will be more clearly understood from the following detailed description of non-limiting embodiments of inventive concepts, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION OF THE EMBODIMENTS

Figure 1:
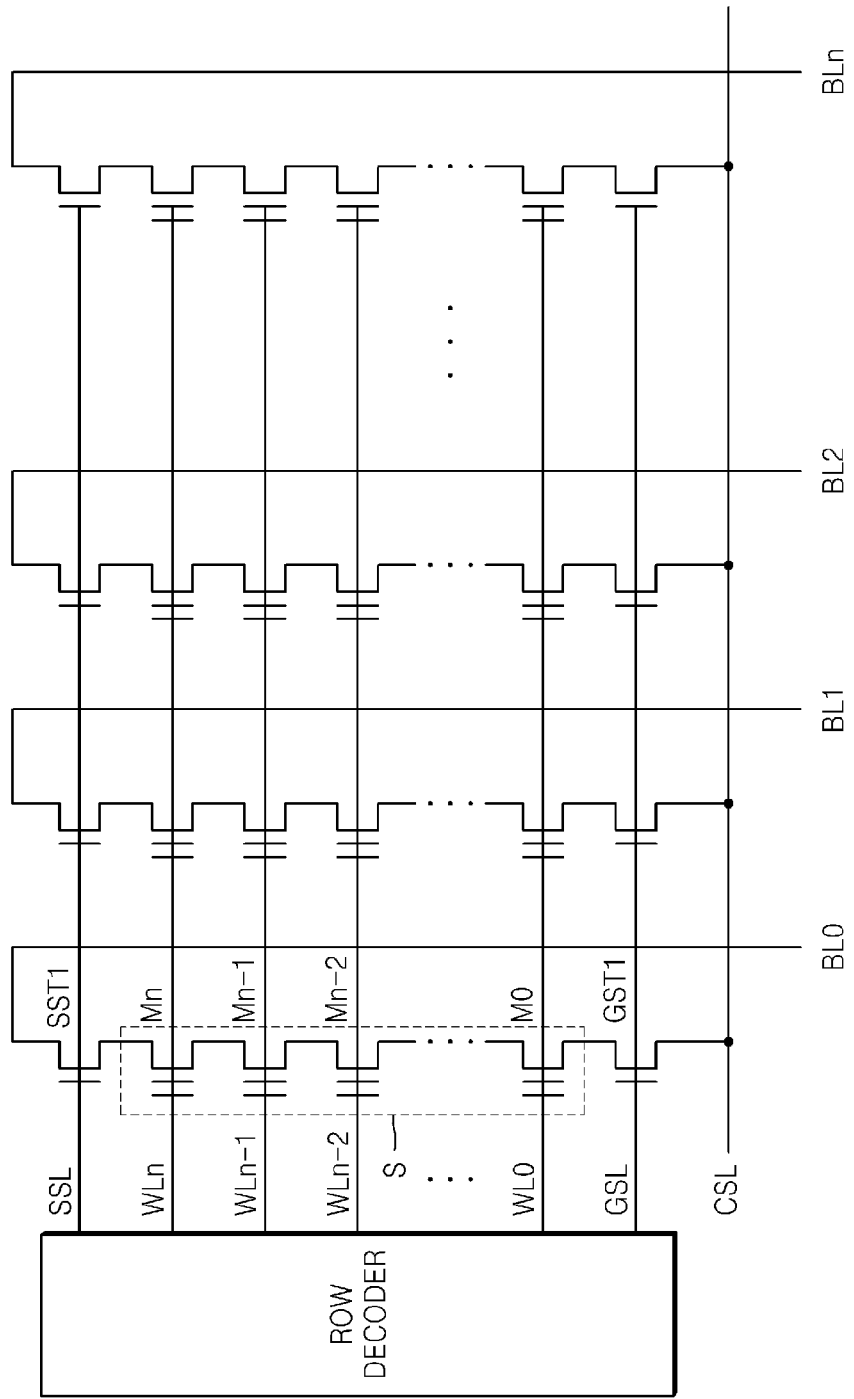
FIGS. 1 and 2 are circuit diagrams illustrating non-volatile memory devices having a vertical structure according to some example embodiments of inventive concepts.

Example embodiments of inventive concepts will now be described more fully with reference to the accompanying drawings, in which some example embodiments of inventive concepts are shown. Example embodiments of inventive concepts may, however, be embodied in many different forms and should not be construed as being limited to the embodiments set forth herein; rather, these embodiments are provided so that this disclosure will be thorough and complete, and will fully convey the scope of example embodiments of inventive concepts to those skilled in the art. However, this is not intended to limit inventive concepts to particular modes of practice. In the description of example embodiments of inventive concepts, certain detailed explanations of related art are omitted when it is deemed that they may unnecessarily obscure the essence of inventive concepts. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Expressions such as "at least one of" when preceding a list of elements, modify the entire list of elements and do not modify the individual elements of the list.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Some example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

A non-volatile memory device may store and retain data even when power is not supplied, stored data. In addition, according to an example embodiment of inventive concepts, in order to increase an integration degree of a memory device, the memory device has a vertical structure (vertical transistor structure) instead of a planar transistor structure. In the specification, a NAND flash memory device will be described as an example of a non-volatile semiconductor memory device. Thus, some example embodiments of inventive concepts may be directly applied to NAND flash memory devices.

Figure 2:
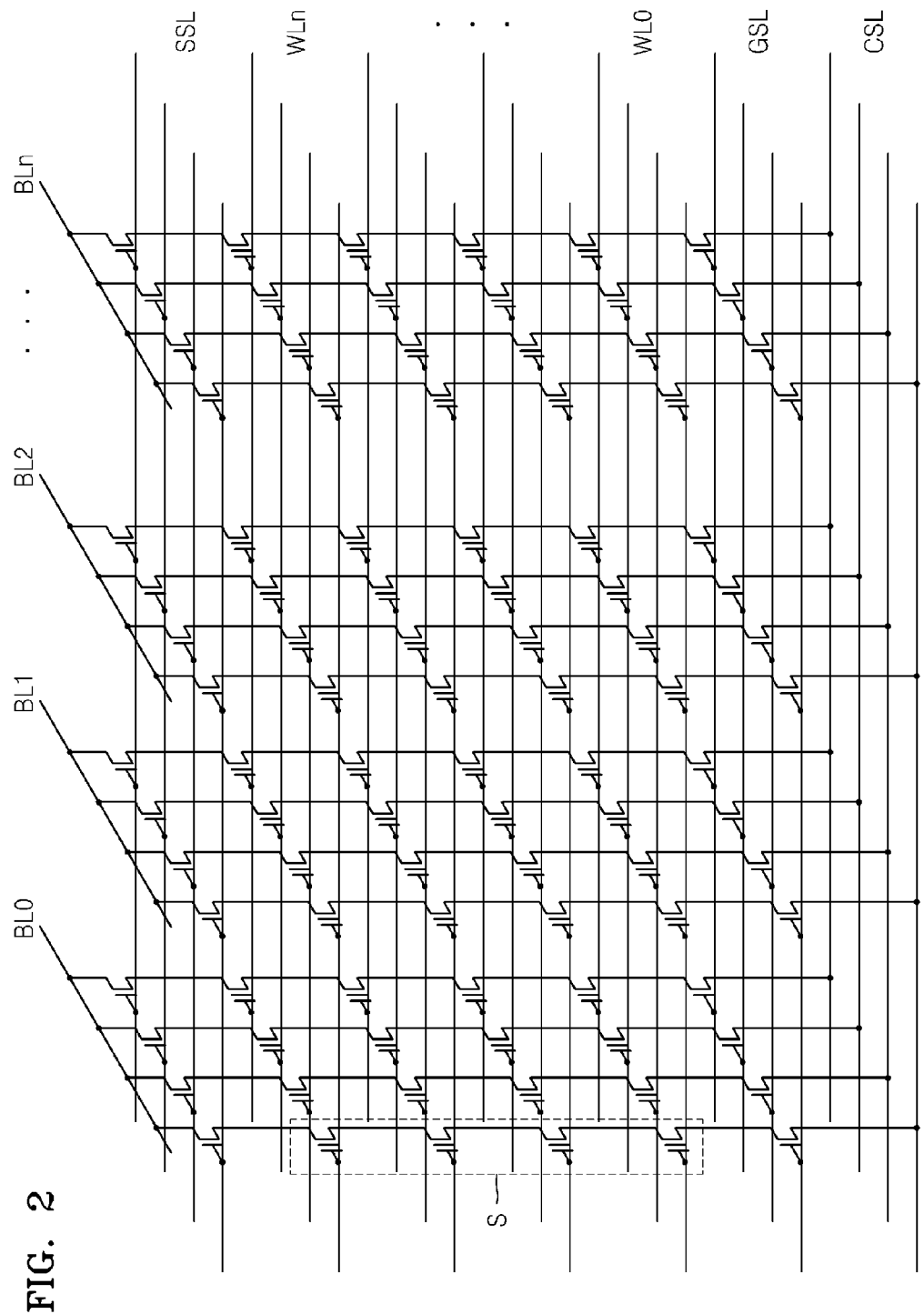

FIGS. 1 and 2 are circuit diagrams illustrating non-volatile memory devices having a vertical structure according to some example embodiments of inventive concepts.

In detail, FIGS. 1 and 2 are respectively two-dimensional and three-dimensional circuit diagrams of non-volatile memory devices having a vertical structure, that is, a NAND flash memory device, according to some example embodiments of inventive concepts. A non-volatile memory device has a structure in which N cell transistors M0 through Mn are serially connected to form a unit string S, and unit cell strings S are connected in parallel between bit lines BL0 through BLn and ground selecting lines GSL.

A non-volatile memory device having a vertical structure may include cell strings S in which cell transistors M0 through Mn are serially connected, word lines WL0 through WLn used to select the cell transistors M0 through Mn, a row decoder for driving the word lines WL0 through WLn, a string selecting line SSL that is connected to a string selection transistor SST1 at a first side of the cell string S, bit lines BL0 through BLn that are connected to a drain of the string selecting transistor SST1, and a ground selecting line GSL that is connected to a ground selecting transistor GST1 at a second side of the cell string S. In addition, a common source line CSL is connected to a source of the ground selecting transistor GST1.

In a non-volatile semiconductor memory device according to some example embodiments of inventive concepts, the cell string S and the string selecting transistor SST1 and the ground selecting transistor GST1 that are connected on and under the cell string S are formed as a unit string. In addition, while one string selecting transistor SST1 and one ground selecting transistor GST1 are connected to the cell string S to form a unit string in FIGS. 1 and 2, two or more string selecting transistors SST1 may be included, and also, two or more ground selecting transistors GST1 may be included. Hereinafter, description will be given with reference to a unit string including the cell string S.

Figure 3:
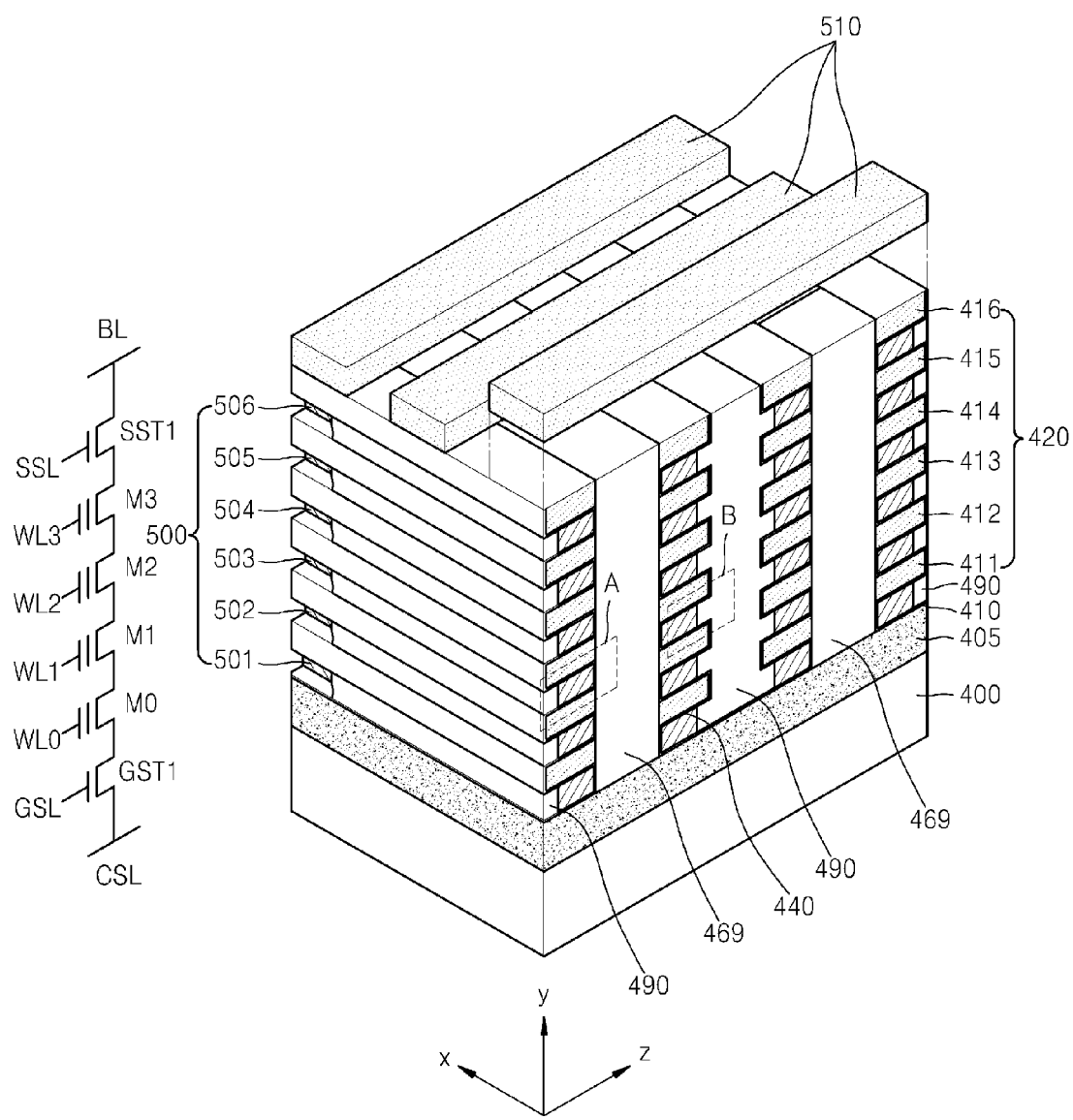
FIG. 3 is a perspective view of a non-volatile memory device having a vertical structure according to an example embodiment of inventive concepts.
Figure 4A:
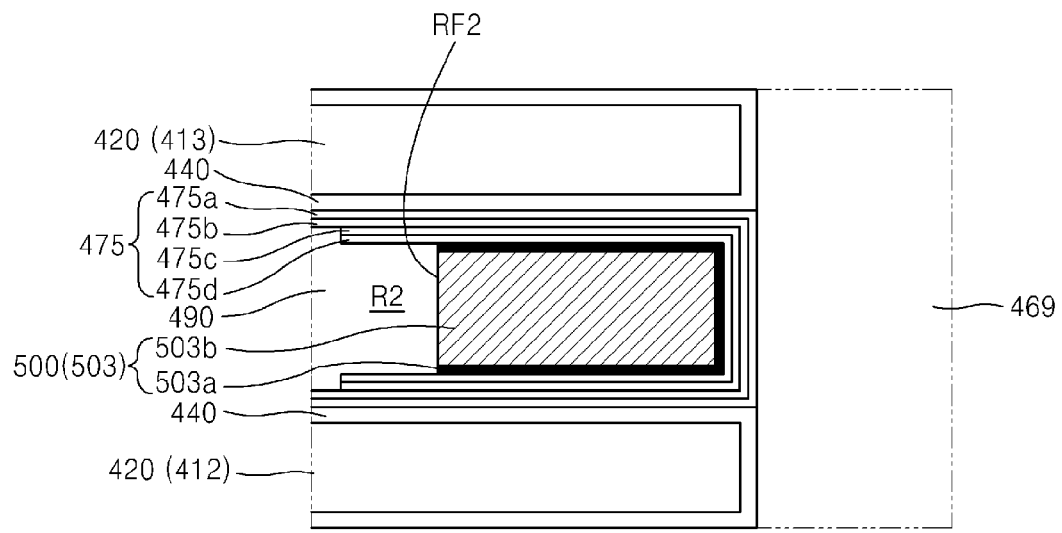
FIGS. 4A and 4B are expanded cross-sectional views illustrating portions A and B of the non-volatile memory device having a vertical structure in FIG. 3.
Figure 4B:
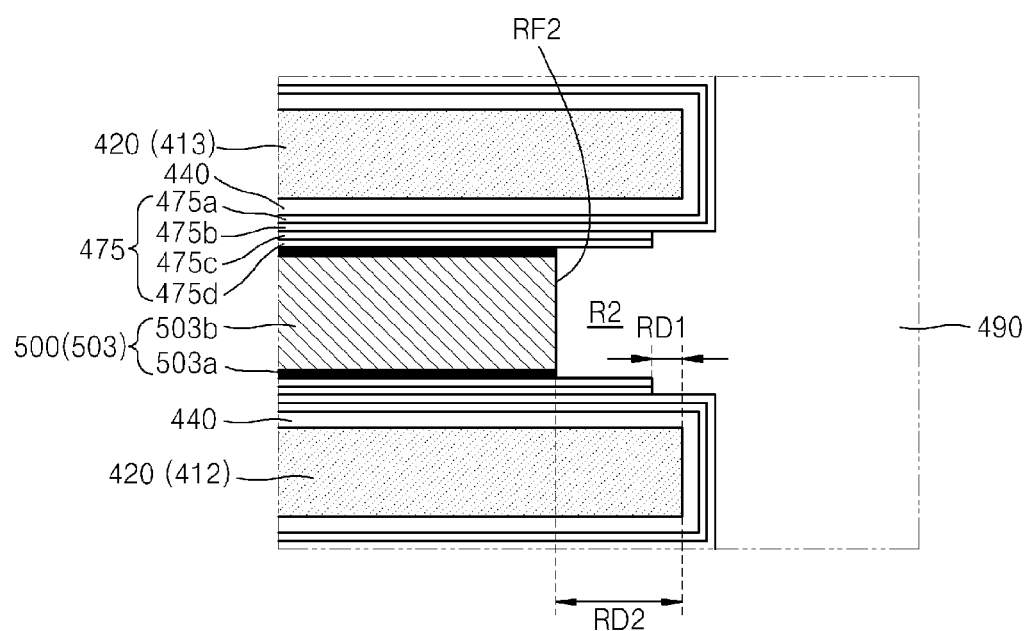

FIG. 3 is a perspective view of a non-volatile memory device having a vertical structure according to an example embodiment of inventive concepts, and FIGS. 4A and 4B are expanded cross-sectional views illustrating portions A and B of the non-volatile memory device of FIG. 3 having a vertical structure according to an example embodiment of inventive concepts.

Referring to FIGS. 3, 4A, and 4B, a substrate 400 formed of a single-crystalline (monocrystalline) semiconductor material is provided. For example, the substrate 400 may be formed of a single-crystalline silicon substrate. A single-crystalline silicon substrate may refer to a single-crystalline silicon wafer, for example, a P-type single-crystalline silicon wafer. An impurity region 405 provided as a common source line CSL may be formed below a surface of the substrate 400. The impurity region 405 may be formed of an N-type impurity.

As the impurity region 405 is included, lower portions of the cell strings S formed in a semiconductor layer pattern 469 are connected to one another. The semiconductor layer pattern 469 having a cylinder shape or a pillar shape is disposed on the substrate 400. The semiconductor layer pattern 469 may be repeatedly disposed along a first direction (X-direction) while being separated from one another. The semiconductor layer patterns 469 may be extended in a vertical direction on the substrate 400. Side walls of the semiconductor layer patterns 469 are inclined at an angle that is almost vertical.

The semiconductor layer patterns 469 may be formed of, for example, single-crystalline silicon layers. The semiconductor layer patterns 469 may provide an active region of the non-volatile semiconductor memory device. A plurality of gate patterns 500 and a plurality of interlayer insulating layer patterns 420 are alternately arranged along the side walls of the semiconductor layer patterns 469. Accordingly, transistors are disposed on the side walls of the semiconductor layer patterns 469. The transistors may each include a ground selecting transistor GST1, cell transistors M0 through Mn, and a cell selecting transistor SST1. The cell transistors M0 through Mn formed on each of the semiconductor layer patterns 469 having a cylinder shape form a cell string S. The transistors are serially connected along the semiconductor layer patterns 469 in a vertical direction.

In general, 2m (m is a natural number of 1 or greater) cell transistors M0 through M3 may be formed in each cell string S formed on the substrate 400. In each cell S, two, four, eight, or sixteen cell transistors M0 through Mn may be serially connected, and here in FIG. 3, for convenience of illustration, four cell transistors M0 through M3 are illustrated as being serially connected. However, more than three cell transistors may also be included. In addition, while one string selecting transistor SST1 and one ground selecting transistor GST1 are included in a cell string S to form a unit string, two or more string selecting transistors SST1 may be included, and also, two or more ground selecting transistors GST1 may be included.

The interlayer insulating layer patterns 420 contacting two side walls of the semiconductor layer patterns 469 are included. The interlayer insulating layer patterns 420 are spaced apart from one another at desired (and/or alternatively predetermined) distance, and have a linear pattern extending in the first direction (X-axis direction). The interlayer insulating layer patterns 420 are formed to contact the semiconductor layer patterns 469. The transistors are arranged between the interlayer insulating layer patterns 420 in the Y-axis direction. Accordingly, the interlayer insulating layer patterns 420 define regions where the transistors are to be formed. In addition, the interlayer insulating layer patterns 420 insulate the gate patterns 500 of different layers from one another.

Hereinafter, the interlayer insulating layer patterns 420 will be described more in detail.

A pad oxide layer 410 is formed on a surface of the substrate 400 except the semiconductor layer patterns 469. A first interlayer insulating layer material layer 411 is formed between a first gate pattern 501 and a second gate pattern 502 formed on the pad oxide layer 410. A second interlayer insulating material layer 412 is disposed between the second gate pattern 502 and a third gate pattern 503. Interlayer insulating material layers 411 through 416 are formed between the gate patterns 501 through 506 in this manner.

The interlayer insulating layer patterns 420 have linear forms extending in the first direction while contacting the side walls of the semiconductor layer patterns 469 that are adjacent thereto in a second direction (Y-axis direction) that is vertical to the first direction. The interlayer insulating layer patterns 420 may be formed of a dielectric such as silicon oxide, but example embodiments of inventive concepts are not limited thereto. As described above, transistors are included on the side walls of the semiconductor layer patterns 469 disposed between the interlayer insulating layer patterns 420.

While FIG. 3 illustrates the plurality of interlayer insulating layer patterns 420 may include six interlayer insulating material layers 411 to 416, example embodiments of inventive concepts are not limited thereto. A non-volatile memory device according to other example embodiments of inventive concepts may include more or fewer interlayer insulating material layers. Similarly, while FIG. 3 illustrates the plurality of gate patterns 500 may include six gate patterns 501 to 506, example embodiments of inventive concepts are not limited thereto. A non-volatile memory device according to other example embodiments of inventive concepts may include more or fewer gate patterns.

Hereinafter, transistors formed on the semiconductor layer patterns 469 will be described in detail.

A storage structure 475 including a tunnel insulating layer 475a, a charge storage layer 475b, and blocking insulating layers 475c and 475d is formed on a first side wall of the semiconductor layer patterns 469. That is, the storage structure 475 is interposed between the gate patterns 500 and the semiconductor layer patterns 469. The storage structure 475 may be continuously extended between the interlayer insulating layer patterns 420 and the gate patterns 500 along the gate patterns 500. The features of the storage structure 475 are illustrated in FIGS. 4A and 4B of the present application. FIGS. 4A and 4B are expanded cross-sectional views illustrating portions A and B of the non-volatile memory device having a vertical structure in FIG. 3

Referring to FIGS. 3, 4A and 4B, the tunnel insulating layer 475a is formed on a first side wall of the semiconductor layer patterns 469. The tunnel insulating layer 475a is formed of a tunnel oxide layer.

A blocking layer 440 may be formed between the tunnel insulating layer 475a and the interlayer insulating layer patterns 420. The blocking layer 440 may reduce (and/or prevent) spreading or moving of charges in a vertical direction, that is, in the Y-axis direction. At least a portion of the tunnel insulating layer 475a contacts a side wall of the semiconductor layer patterns 469, and the contacting portions are spaced apart from each other in a vertical direction (Y-axis direction). The tunnel insulating layer 475a may discontinuously contact a side wall of the semiconductor layer patterns 469. The tunnel insulating layer 475a may be formed of a thermal oxide layer that is formed by thermally oxidizing a surface of the semiconductor layer patterns 469. The tunnel insulating layer 475a may be formed of a silicon oxide formed using a thermal oxidizing process, but example embodiments of inventive concepts are not limited thereto.

As the tunnel insulating layer 475a is formed by thermally oxidizing a portion of the semiconductor layer patterns 469, the tunnel insulating layer 475a has better durability compared to a tunnel insulating layer formed using a chemical vapor deposition (CVD) method. Accordingly, the non-volatile memory device according to an example embodiment of inventive concepts may have excellent reliability. However, alternatively, according to another example embodiment of inventive concepts, the tunnel insulating layer 475a may also be formed of an oxide formed using a CVD method.

As illustrated in FIG. 4A, the tunnel insulating layer 475a may extend along the surfaces of the semiconductor layer patterns 469 and the interlayer insulating layer patterns 420. In this case, the tunnel insulating layers 475a on each layer are not separated but connected to one another. According to another example embodiment of inventive concepts, while not shown in the drawings, the tunnel insulating layer 475a may be disposed only on a side wall of the semiconductor layer patterns 469 between the interlayer insulating layer patterns 420.

A charge storage layer 475b is disposed on the tunnel insulating layer 475a. The charge storage layer 475b may be formed of a silicon nitride or a metal oxide that is capable of trapping charges. In this case, charges are stored in the charge storage layer 475b using a charge trapping method. The charge storage layer 475b may be formed of a silicon nitride which may be deposited in a thin thickness.

The charge storage layer 475b disposed in the first direction (X-axis direction) in each layer is formed as a single, continuous layer. However, since the charge storage layer 475b is formed of an insulating material, even when the charge storage layers 475b is formed as a continuous layer in the first direction, transistors that commonly include the charge storage layers 475b are not electrically connected to one another. As illustrated in FIG. 4A, the charge storage layer 475b formed on the semiconductor layer patterns 469 may also be formed as a continuous layer in a vertical direction (Y-axis direction). The charge storage layer 475b may be continuously formed along the side walls of the semiconductor layer patterns 469 and profiles of upper and lower surfaces of the interlayer insulating layer patterns 420. Alternatively, although not shown in the drawings, the charge storage layer 475b formed on the semiconductor layer patterns 469 may be separated in a vertical direction.

Blocking insulating layers 475c and 475d are formed on the charge storage layer 475b. The blocking insulating layers 475c and 475d may be formed of a silicon oxide or a metal oxide. A metal oxide may have a higher permittivity than a silicon oxide. While the blocking insulating layers 475c and 475d have a two-layer structure in FIG. 3 in order to adjust permittivity, they may also be formed as a single layer. For example, the blocking insulating layer 475c may be formed using a silicon oxide, and the blocking insulating layer 475d may be formed of a metal oxide. In addition, like the charge storage layer 475b, the blocking insulating layers 475c and 475d disposed in the same layer in the first direction (X-axis direction) may be connected to one another in a horizontal direction.

Also, as illustrated in FIG. 4A, the blocking insulating layers 475c and 475d formed on the semiconductor layer patterns 469 may be respectively continuous in a vertical direction (Y-axis direction). The blocking insulating layers 475c and 475d may have a continuous form along profiles of a side wall of the semiconductor layer patterns 469 and upper and lower surfaces of the interlayer insulating layer patterns 420. Alternatively, according to another example embodiment of inventive concepts, the blocking insulating layers 475c and 475d formed on the semiconductor layer patterns 469 may be separated in a vertical direction.

The cell transistors M0 through M3 are electrically turned on or off by Fowler-Nordheim (F-N) tunneling or hot electron injection. Also, the storage structure 475 including the tunnel insulating layer 475a, the charge storage layer 475b, and the blocking insulating layers 475c and 475d may perform the function as a gate insulating layer of the ground selecting transistor GST1 and the string selecting transistor SST1.

The gate patterns 500 are disposed on surfaces of the blocking insulating layers 475c and 475d, and the gate patterns 500 are disposed between the interlayer insulating layer patterns 420. The gate patterns 500 may be formed of a barrier layer pattern 503a and a conductive layer pattern 503b. The barrier layer pattern 503a may be formed on the blocking insulating layers 475c and 475d. The barrier layer pattern 503a may be formed of a metal nitride layer, for example, titanium nitride layer (TiN). The conductive layer pattern 503b may be formed of a metal layer, for example, tungsten (W).

The gate patterns 500 include control gate patterns 502 through 505 used to control cell transistors and typical gate patterns 501 and 506 used to control a ground selecting transistor or a string selecting transistor. The upper and lower surfaces and the side walls of the gate patterns 500 contact the blocking insulating layers 475c and 475d. The gate patterns 500 are disposed to face the semiconductor layer patterns 469.

The gate patterns 500 disposed in the same layer in the first direction (X-axis direction) have linear forms. The gate patterns 500 are provided as the word lines WL0 through WL3, the string selecting lines SSL, and the ground selecting lines GSL. The gate patterns 500 disposed in different layers are insulated from one another by the interlayer insulating layer patterns 420. The gate patterns 500 may be formed on the semiconductor layer patterns 469 while the tunnel insulating layer 475a, the charge storage layer 475b, and the blocking insulating layers 475c and 475d being interposed.

The gate patterns 500 are recessed in side walls of the interlayer insulating patterns 420 facing a side wall of the semiconductor layer pattern 469 toward the semiconductor layer patterns 469 as denoted by a reference numeral R2. A recessed surface RF2 of the gate patterns 500 may be set to be vertical to the surface of the substrate 400. Recess depths RD2 of the barrier layer pattern 503a and the conductive layer pattern 503b may be set to be the same from the side wall of the interlayer insulating layer patterns 420 toward the semiconductor layer pattern 469. According to another example embodiment of inventive concepts, as will be described later in FIGS. 15 to 18, a recess depth of the barrier layer pattern 503a may be increased to be greater than that of the conductive layer pattern 503b from the side wall of the interlayer insulating layer patterns 420 toward the semiconductor layer pattern 469. When the gate patterns 500 are recessed in this manner, the gate patterns 500 may be electrically separated in each layer with reliability. Also, the blocking insulating layers 475c and 475d may be recessed by a recess depth RD1 from the side wall of the interlayer insulating layer patterns 420 toward the semiconductor layer pattern 469. Accordingly, unit strings may be insulated from one another.

An isolation insulating layer 490 is disposed between the interlayer insulating layer patterns 420 and the gate patterns 500 in the second direction (Z-direction). The isolation insulating layer 490 may be formed of a silicon oxide layer, but example embodiments of inventive concepts are not limited thereto. The isolation insulating layer 490 has a linear form extending in the first direction (X-direction), and the gate patterns 500 formed on each side wall of the semiconductor layer patterns 469 adjacent thereto are insulated by using the isolation insulating layer 490.

A bit line 510 that electrically connects upper surfaces of the semiconductor layer pattern 469 is included. As illustrated in FIG. 3, the bit line 510 may be directly connected to the upper surfaces of the semiconductor layer patterns 469 in some example embodiments of inventive concepts, and thus a bit line contact plug may be not necessary. According to another example embodiment of inventive concepts, a bit line contact plug (not shown) contacting the upper surfaces of the semiconductor layer patterns 469 may also be included.

The semiconductor layer patterns 469 may be entirely doped with an N-type impurity. In this case, a transistor including the cell transistors M0 through M3, the string selecting transistor SST1, and the ground selecting transistor GST1 has an on state in a standby state, and may be converted to an off state by a voltage applied to the gate patterns 500. However, on the other hand, a source/drain region (not shown) doped with an N-type impurity may also be disposed below a surface of the side wall of the semiconductor layer patterns 469 contacting the interlayer insulating layer patterns 420 in each of the semiconductor layer patterns 469. In addition, a channel region or a channel doping region doped with a P-type impurity, which is an opposite conductivity type to that of the source/drain region, may be disposed below the surface of the side wall of the semiconductor layer patterns 469 contacting the tunnel insulating layer 475a.

In the non-volatile semiconductor memory device illustrated in FIG. 3, a unit string is included in each of the semiconductor layer patterns 469 having a pillar shape or a cylinder shape. As the side walls of the semiconductor layer patterns 469 have an inclination that is almost vertical, an integration degree of the non-volatile semiconductor memory device is further increased. In addition, the tunnel insulating layer 475a included in each cell transistor stacked in a vertical direction is formed of a thermal oxide layer, and thus durability of the cell transistor may be excellent.

FIGS. 5 through 14 are perspective views illustrating a method of manufacturing a non-volatile memory device having a vertical structure according to an example embodiment of inventive concepts.

Figure 5:
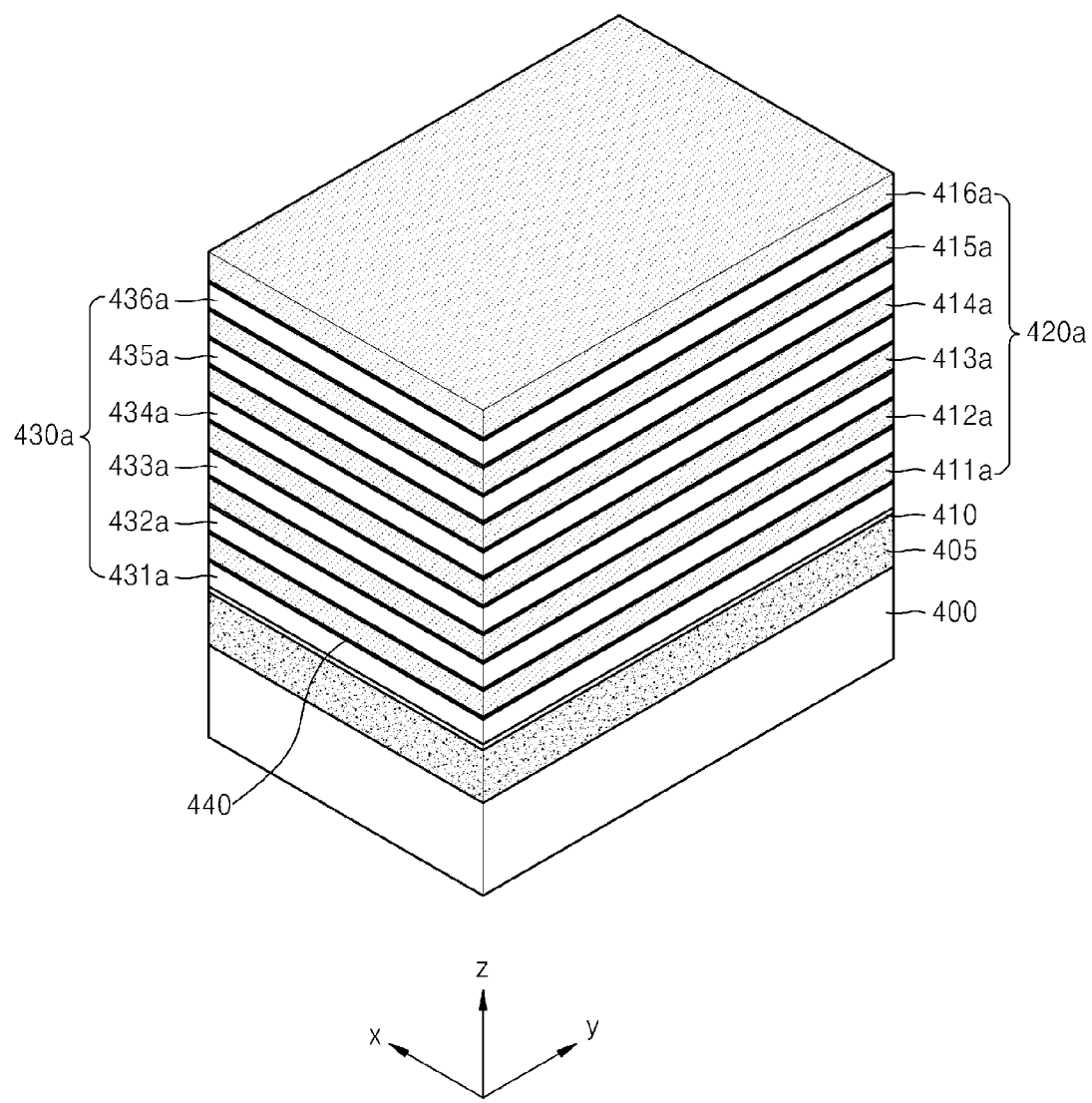
FIGS. 5 through 14 are perspective views illustrating a method of manufacturing a non-volatile memory device having a vertical structure according to an example embodiment of inventive concepts.

Referring to FIG. 5, a substrate 400 formed of single-crystalline silicon is provided. The substrate 400 may be a single-crystalline silicon wafer. By doping a surface region of the substrate 400 with an N-type impurity, an impurity region 405 used as a common source line of a NAND flash memory device is formed. The impurity region 405 may be formed by doping an N-type impurity below the surface of the substrate 400 where a cell block is formed.

A pad oxide layer 410a is formed on the substrate 400 on which the impurity region 405 is formed. The pad oxide layer 410a may be formed by thermally oxidizing the substrate 400 or depositing an oxide layer using a CVD method. The pad oxide layer 410a is provided to reduce stresses occurring when a sacrificial material layer formed of a silicon nitride directly contacts the substrate 400. Material layers 431a through 436a and 411a through 416a which are respectively used to form a sacrificial layer 430a and an interlayer insulating layer 420a are alternately and repeatedly stacked on the pad oxide layer 410a. The sacrificial layer 430a and the interlayer insulating layer 420a may be formed using a CVD method.

The sacrificial layer 430a is to be formed of a material having an etching selectivity with respect to each of the interlayer insulating layer 420a and monocrystalline silicon. Also, the sacrificial layer 430a is to be formed of a material that is easily removed using a wet etching process. According to an example embodiment of inventive concepts, the sacrificial layer 430a is formed of a silicon nitride, and the interlayer insulating layer 420a is formed of a silicon nitride.

According to the an example embodiment of inventive concepts, a sacrificial material layer 431a is formed in a lowermost portion of the structure that is repeatedly stacked, and an interlayer insulating material layer 416a is disposed in an uppermost portion of the structure. The sacrificial layer 430a is removed in a subsequent process to thereby define a portion where a gate pattern of each layer is to be formed. Accordingly, the sacrificial layer 430a may preferably be formed to have a thickness that is equal or greater than an effective length of the gate pattern of each layer.

As a gate pattern is formed in the portion where the sacrificial layer 430a is removed, the number of the sacrificial layer 430a and the interlayer insulating layer 420a being stacked is to be equal to or greater than the number of transistors included in a unit string. According to the an example embodiment of inventive concepts, six transistors may be connected to a unit string, as illustrated in FIG. 5, first through sixth sacrificial material layers 431a through 436a and first through sixth interlayer insulating material layers 411a through 416a are alternately stacked. If more transistors than this are included in a unit string, more sacrificial layers than the first through sixth sacrificial material layers 431a through 436a and more interlayer insulating material layers than the first through sixth interlayer insulating material layers 411a through 416a are to be further stacked.

According to an example embodiment of inventive concepts, a blocking layer 440 may be formed on upper and lower surfaces of the sacrificial material layer 432a that is included in the sacrificial layer 430a. As will be described later, the blocking layer 440 is formed to reduce (and/or prevent) charge spreading or moving when the non-volatile memory device operates.

Figure 6:
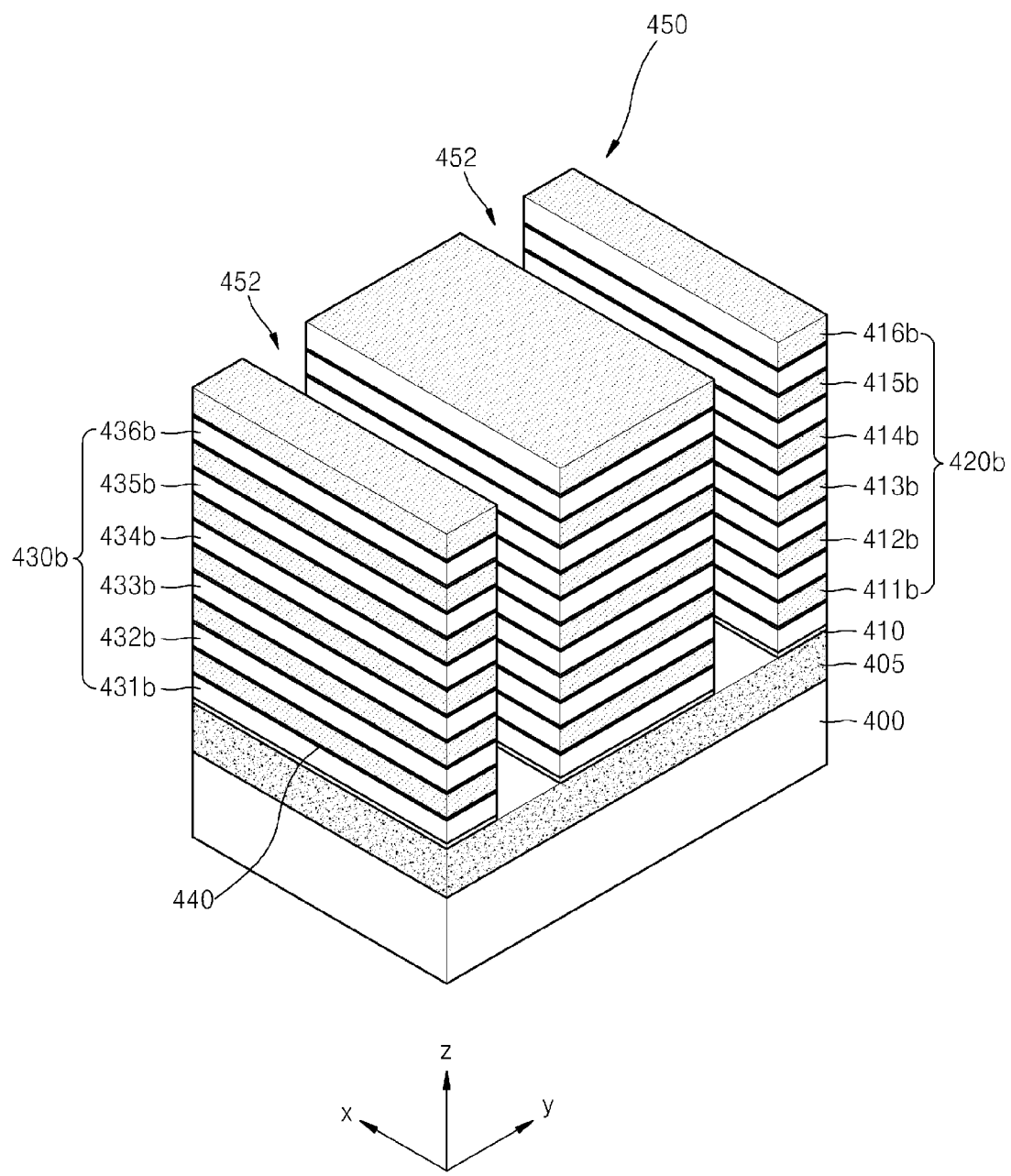

Referring to FIG. 6, a first photoresist pattern (not shown) is formed on the interlayer insulating material layer 416a which is in the uppermost portion. The first photoresist pattern has a linear form extending in the first direction (X-axis direction). By sequentially etching the sacrificial layer 430a and the interlayer insulating layer 420a by using the first photoresist pattern as an etching mask, a stacking structure 450 including a plurality of first openings 452 extending in the first direction is formed.

The stacking structure 450 is formed of a plurality of sacrificial layer patterns 430b and a plurality of interlayer insulating layer patterns 420b. The plurality of sacrificial layer patterns 430b include first through sixth sacrificial material layer patterns 431b to 436b. The plurality of interlayer insulating layers 420b includes first to sixth interlayer insulating layers 411b through 416b. The stacking structure 450 has a linear form extending in the first direction. A surface of the substrate 400 may be exposed through the first openings 452. According to necessity, a portion of the pad oxide layer 410 or a portion of the sacrificial material layer may be left without exposing the surface of the substrate 400. To manufacture a highly integrated semiconductor device, the first openings 452 may have a smallest width that may be formed using a photolithography process. In a subsequent process, a monocrystalline semiconductor pattern having a pillar shape or a cylinder shape may be formed in the first openings 452.

Figure 7:
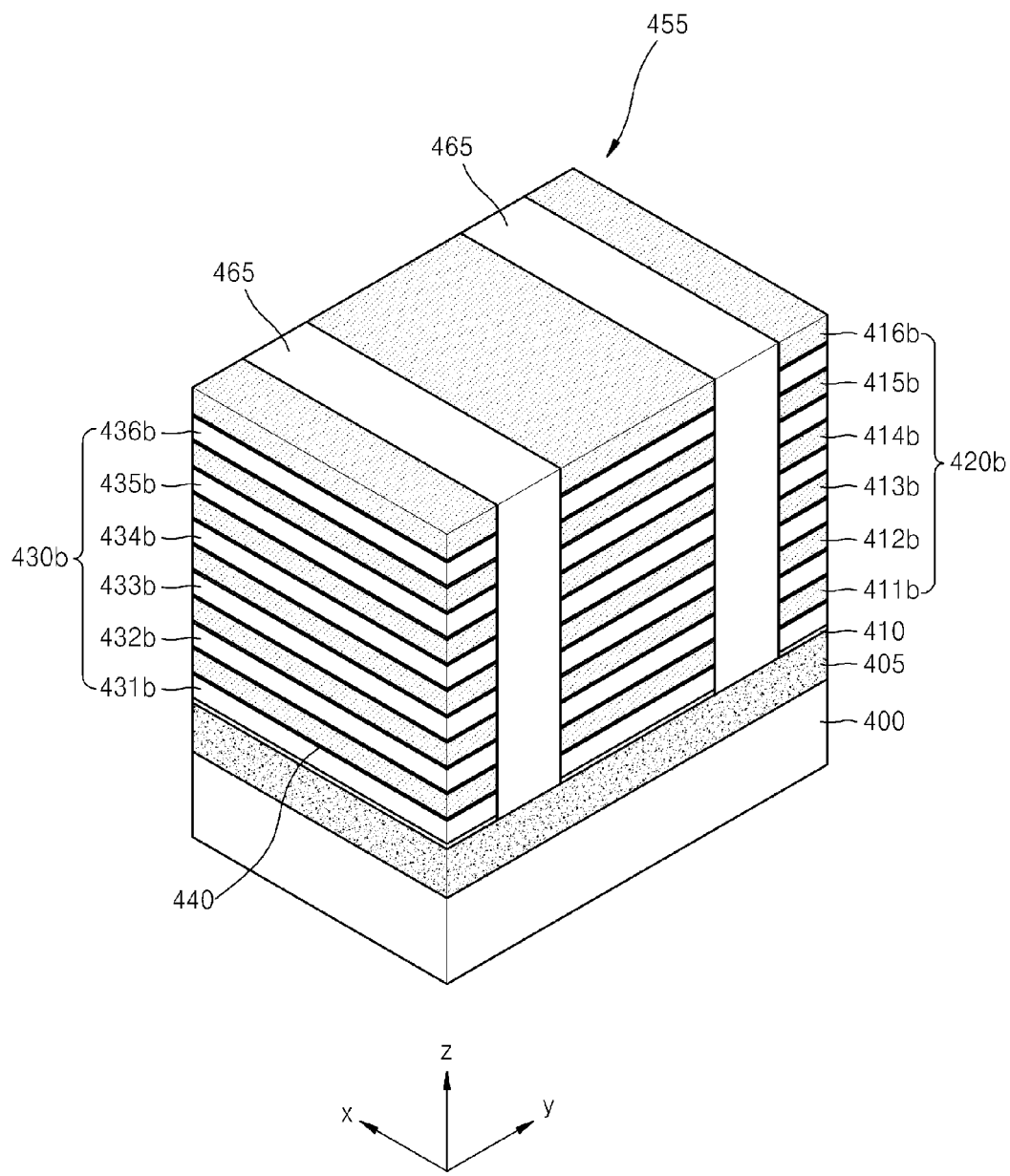

Referring to FIG. 7, a semiconductor layer 465 is formed on the substrate 400 in the first openings 452. Accordingly, a semiconductor structure 455 including the semiconductor layer 465 is formed. The semiconductor layer 465 may be formed of a single-crystalline silicon layer. The semiconductor layer 465 may be an active region of a non-volatile semiconductor memory device.

The single-crystalline silicon layer that forms the semiconductor layer 465 may be formed by performing a phase change in a crystalline silicon layer or an amorphous silicon using a heating process in which a furnace is used, or by performing a phase change in a crystalline silicon layer or an amorphous silicon using a laser epitaxial growth (LEG) process, a solid phase epitaxy (SPE) process, or a metal induced crystallization in which a metal catalyst is used. Alternatively, a single-crystalline silicon layer used to form the semiconductor layer 465 may be formed using a selective epitaxy growth process in which the substrate 400 is used as a seed.

Figure 8:
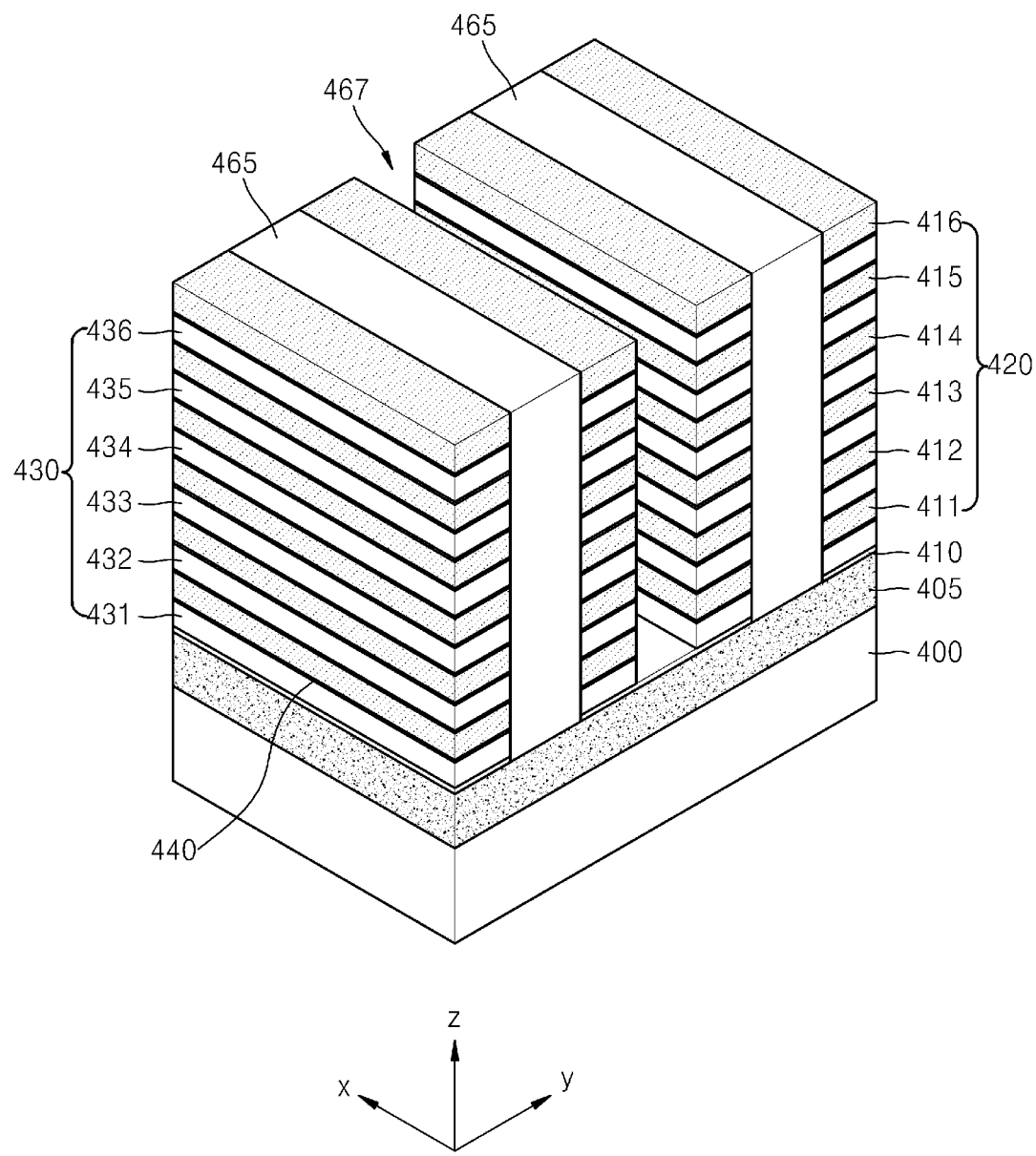

Referring to FIG. 8, a second photoresist pattern (not shown) that exposes a portion of the stacking structure 450 between the semiconductor layers 465 is formed on the semiconductor layers 465, the plurality of sacrificial layer patterns 430b, and the interlayer insulating layer patterns 420b illustrated in FIG. 7. The portion exposed by the second photoresist pattern has a linear form extending in the first direction.

Next, each layer of the stacking structure 450 is sequentially etched by using the second photoresist pattern as an etching mask, thereby forming a second opening 467. The interlayer insulating layer patterns 420b and the sacrificial layer patterns 430b included in the stacking structure 450 are sequentially etched, thereby forming a plurality of sacrificial layer patterns interlayer insulating patterns 420 and a plurality of sacrificial layer patterns 430. The second opening 467 formed in this manner has a form extending in the first direction. The plurality of sacrificial layer patterns 430 include first through sixth sacrificial material layer patterns 431 to 436. The plurality of interlayer insulating layers 420 includes first to sixth interlayer insulating layers 411 through 416.

Figure 9:
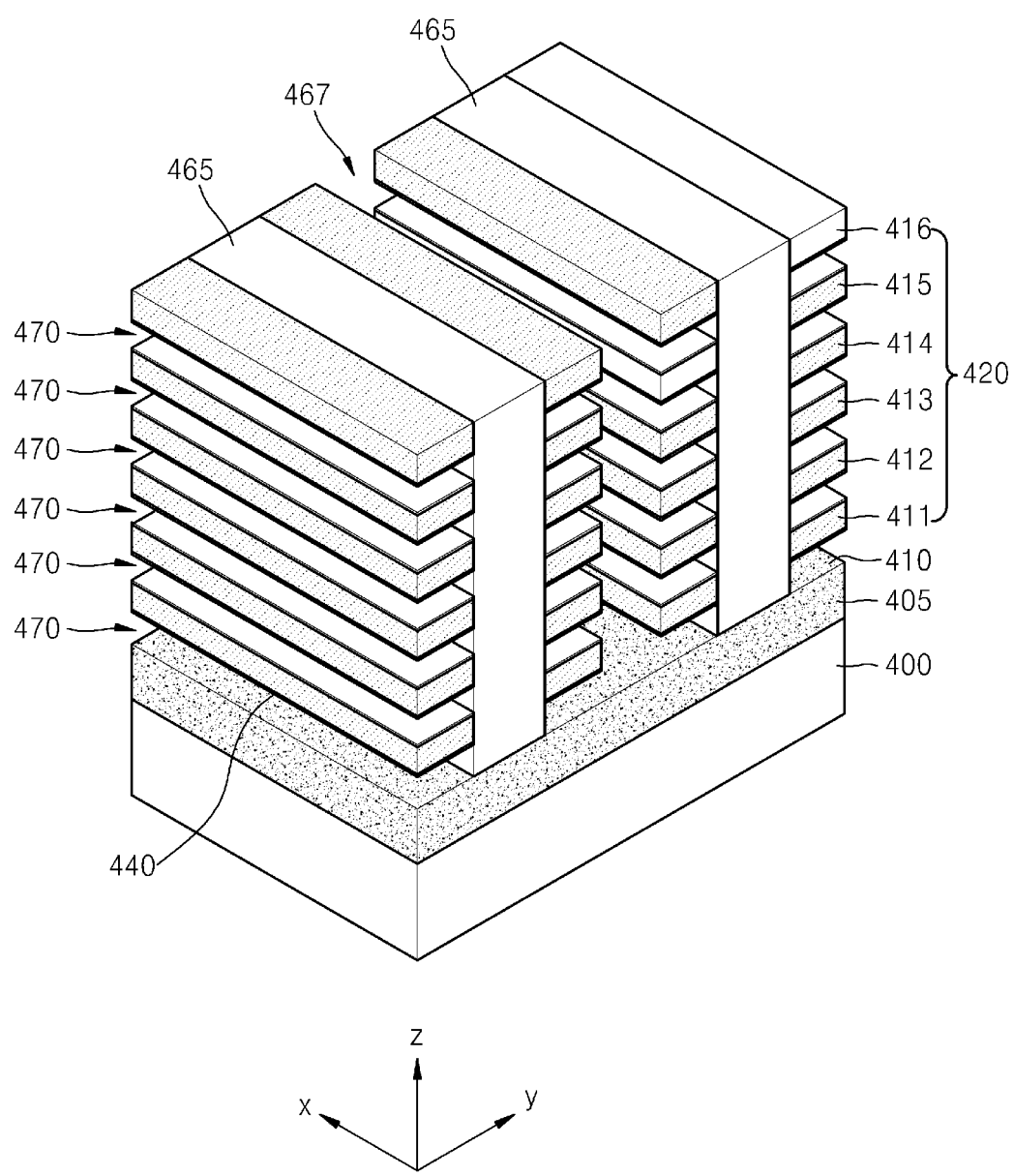

Referring to FIG. 9, by removing the sacrificial layer patterns 430 exposed to side walls of the second opening 467 using a wet etching process, a rib groove 470 connected to a side portion of the second opening 467 is formed. A side wall of the semiconductor layer 465 is exposed through the second opening 467.

As the process is performed, interlayer insulating layer patterns 420 extending in the first direction are formed on a side wall of the semiconductor layer 465. Also, a rib groove 470 is formed between the interlayer insulating layer patterns 420. In a subsequent process, a transistor is formed in the rib groove 470. The exposed portion of the semiconductor layer 465 is a channel region. In addition, the portion of the semiconductor layer 465 covered by the interlayer insulating layer patterns 420 is a source/drain region.

Accordingly, after forming the rib groove 470, a channel doping region may also be formed by implanting a P-type impurity into the exposed portion of the semiconductor layer 465. In order to uniformly implant an impurity in the exposed portion of the side wall of the semiconductor layer 465, the implantation of the impurity may preferably be performed using a plasma doping process. The channel doping region is doped in order to adjust a threshold voltage of a cell transistor. The impurity doping process for forming a channel doping region may also be omitted.

Figure 10:
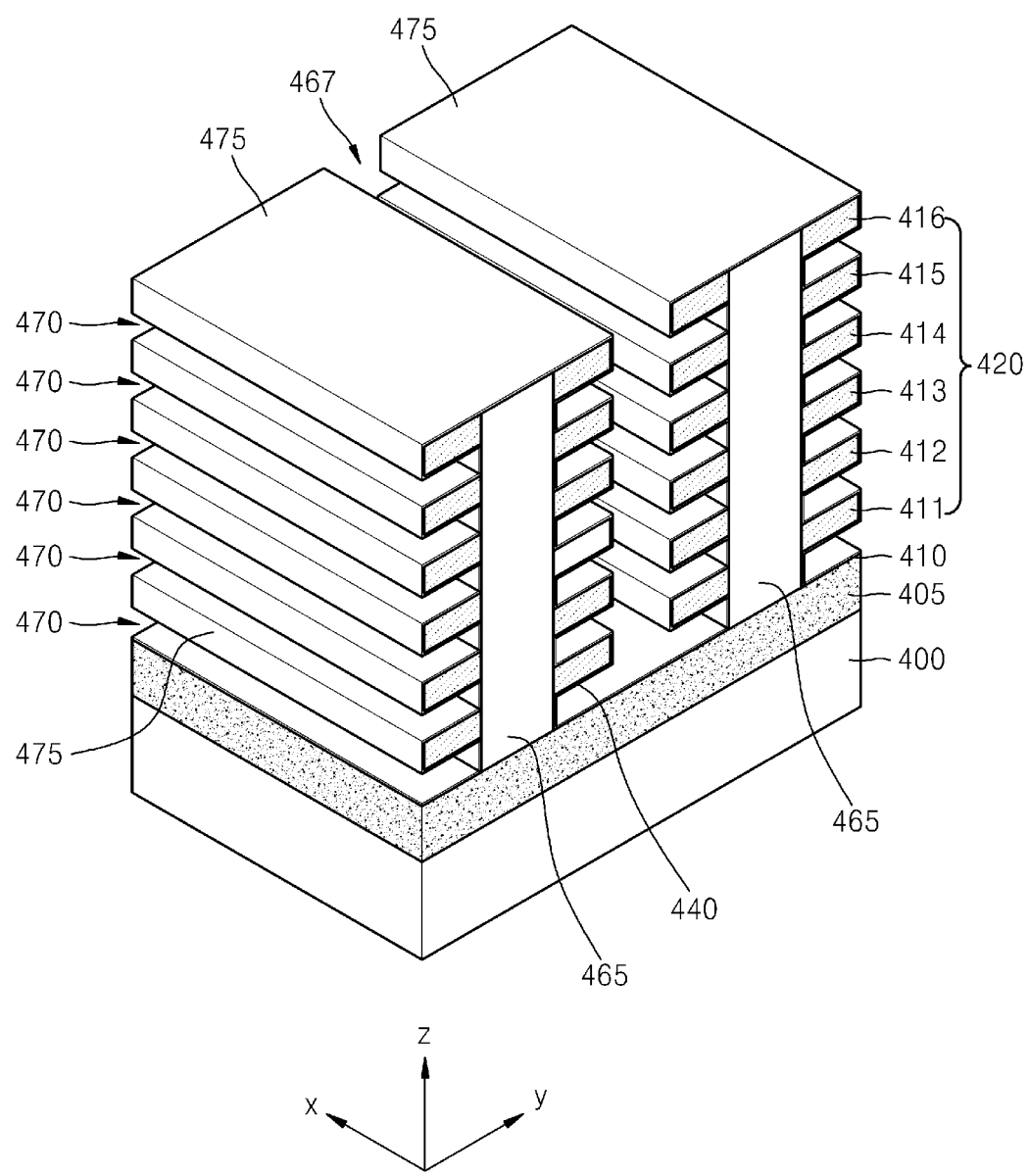

Referring to FIGS. 10, 4A, and 4B, a tunnel insulating layer 475a is formed by thermally oxidizing the semiconductor layer 465. The tunnel insulating layer 475a may be formed of a silicon oxide layer. The tunnel insulating layer 475a may be formed using a thermal oxidizing process. As described above, as the tunnel insulating layer 475a is formed using a thermal oxidizing process, durability of the tunnel insulating layer 475a is improved. Accordingly, reliability of the completed cell transistor is improved.

According to another example embodiment of inventive concepts, the tunnel insulating layer 475a may be formed using a CVD method. As described above, by performing a thermal oxidizing process, the tunnel insulating layer 475a is formed on the exposed surface of the semiconductor layer 465. Also, the tunnel insulating layer 475a having a relatively small thickness may also be formed on the surface of the interlayer insulating layer pattern 420 formed of a silicon oxide. Accordingly, the tunnel insulating layer 475a may be formed along the surfaces of the semiconductor layer 465 and the interlayer insulating layer patterns 420.

According to another example embodiment of inventive concepts, by adjusting a thermal oxidization condition, the tunnel insulating layer 475a may not be formed on the surface of the interlayer insulating layer patterns 420 formed of a silicon oxide, but only on the surface of the semiconductor layer 465. In this case, the tunnel insulating layer 475a is separated in each layer.

Next, the charge storage layer 475b is formed along the surface of the tunnel insulating layer 475a. The charge storage layer 475b may be formed using a CVD method. The charge storage layer 475b may be formed by depositing a silicon nitride or a metal oxide. As a silicon nitride and a metal oxide are insulating materials, even when the charge storage layer 475b is formed as a continuous layer, the cell transistors are not electrically shorted with respect to each other.

Next, blocking insulating layers 475c and 475d are formed on a surface of the charge storage layer 475b. The blocking insulating layers 475c and 475d may be formed by depositing a silicon oxide or a metal oxide. As a result, a storage structure 475 formed of the tunnel insulating layers 475a, the charge storage layer 475b, and the blocking insulating layers 475c and 475d is formed in the rib groove 470. A blocking layer 440 that reduces (and/or prevents) spreading or moving of charges during an operation of device may be formed according to necessity between the tunnel insulating layer 475a and the interlayer insulating layer patterns 420. The blocking layer 440 may be formed of an aluminum nitride.

Figure 11:
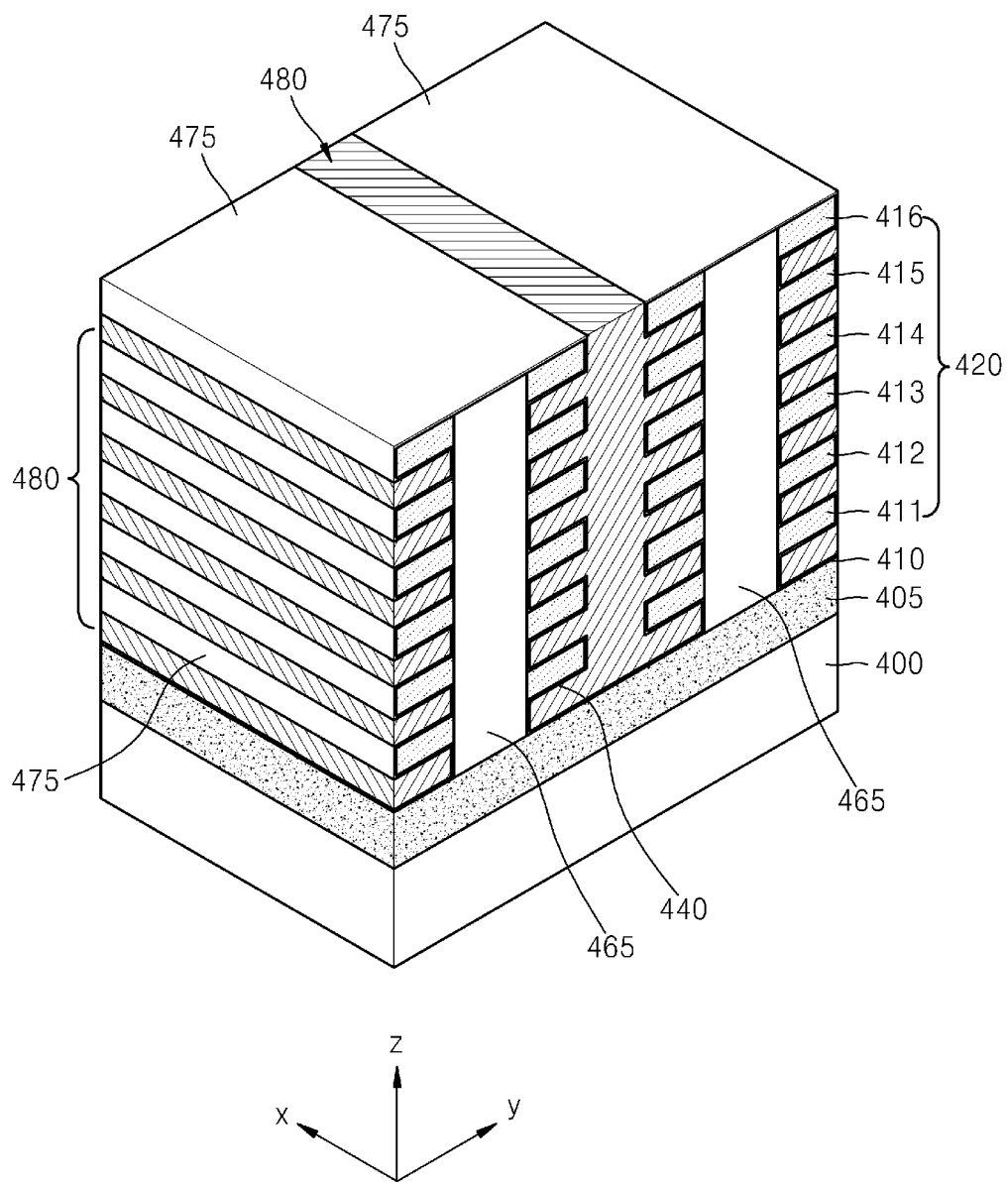

Referring to FIG. 11, a barrier layer (not shown) and a conductive layer 480 are deposited on the blocking insulating layers 475c and 475d so as to completely fill the second opening 467 and the rib groove 470. The barrier layer and the conductive layer 480 are formed to a gate pattern in a subsequent process. In order to fill a conductive material in the second opening 467 and the rib groove 470 without any void, a material having a good step coverage may preferably be used as the conductive material. The barrier layer may be formed of a metal nitride layer, for example, a titanium nitride layer (TiN). The conductive layer 480 may be formed of a metal layer, for example, tungsten (W).

As described above, the gate pattern 500 (see FIG. 12) is formed using a gate replacement process in which the conductive material 480 is filled in the rib groove 470 that defines an area where a gate pattern 500 is to be formed. Accordingly, edges of the tunnel insulating layer 475a are not damaged when forming the gate pattern unlike in a process in which a gate pattern is formed using a typical photolithography etching process. Also, after forming a gate pattern, a damage curing process such as a re-oxidizing process is not required.

Figure 12:
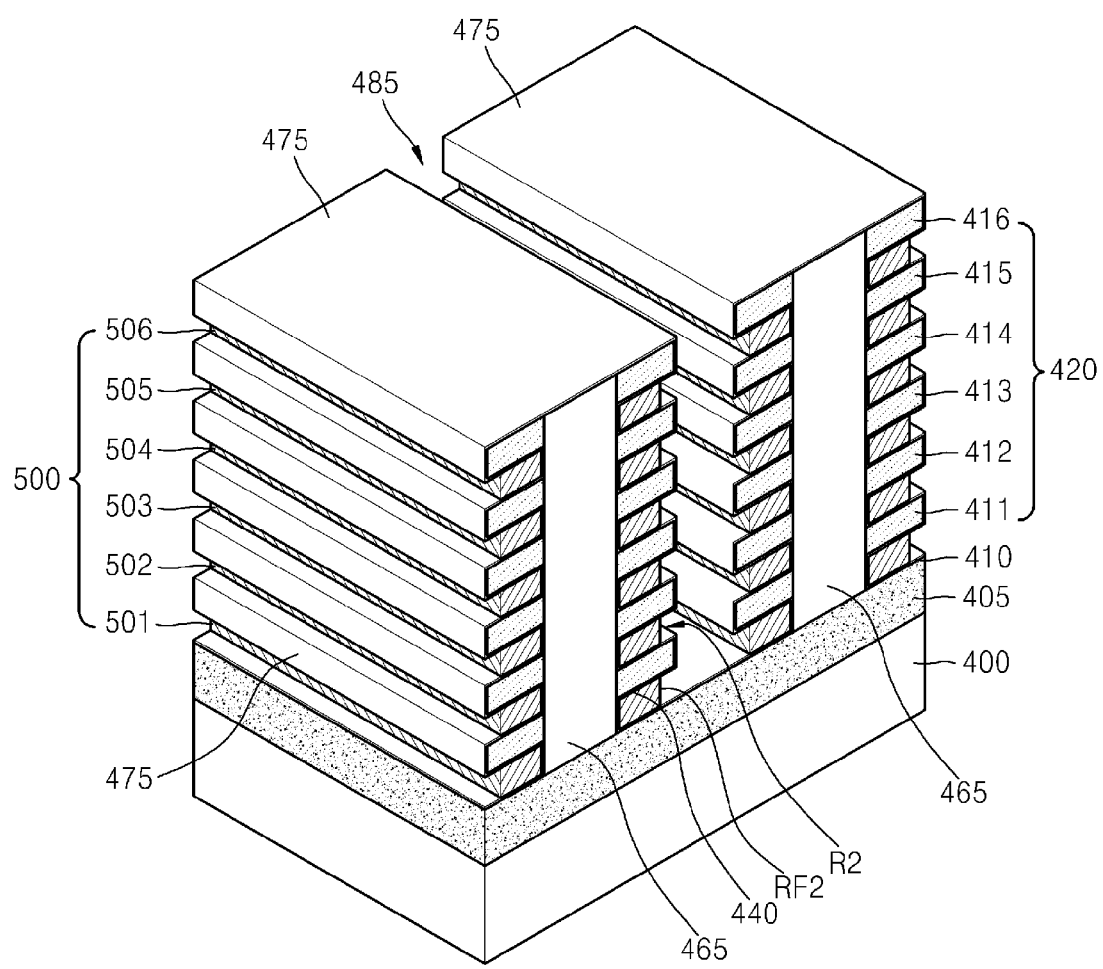

Referring to FIG. 12, a third photoresist pattern (not shown) used to selectively expose an upper surface of the conductive layer 480 formed in the second opening 467 is formed on an upper surface of a resultant. The exposed barrier layer and the conductive layer 480 are etched by using the third photoresist pattern as an etching mask.

Accordingly, in addition to forming a third opening 485 that separates the barrier layer and the conductive layer 480 in each layer in a vertical direction, a gate pattern 500 that is recessed in a direction from the side wall of the interlayer insulating layer patterns 420 facing a side wall of the semiconductor layer patterns 465 toward the semiconductor layer patterns 469 is formed.

The gate pattern 500 is formed between the interlayer insulating layer patterns 420. Upper and lower surfaces and side walls of the gate pattern 500 contact the blocking insulating layers 475c and 475d. The gate pattern 500 of each layer has a linear form extending in the first direction. The gate patterns 500 formed in different layers are insulated from one another.

Figure 17:
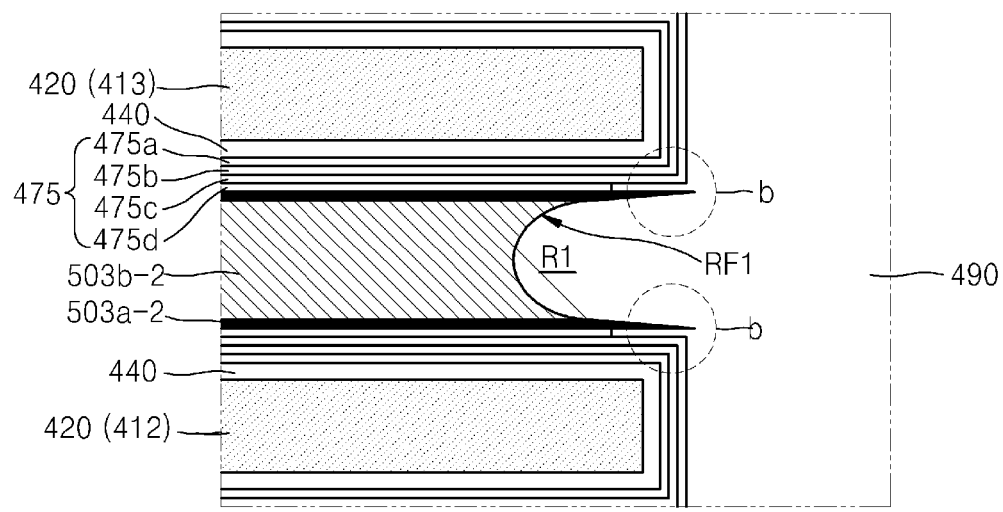
Figure 18:
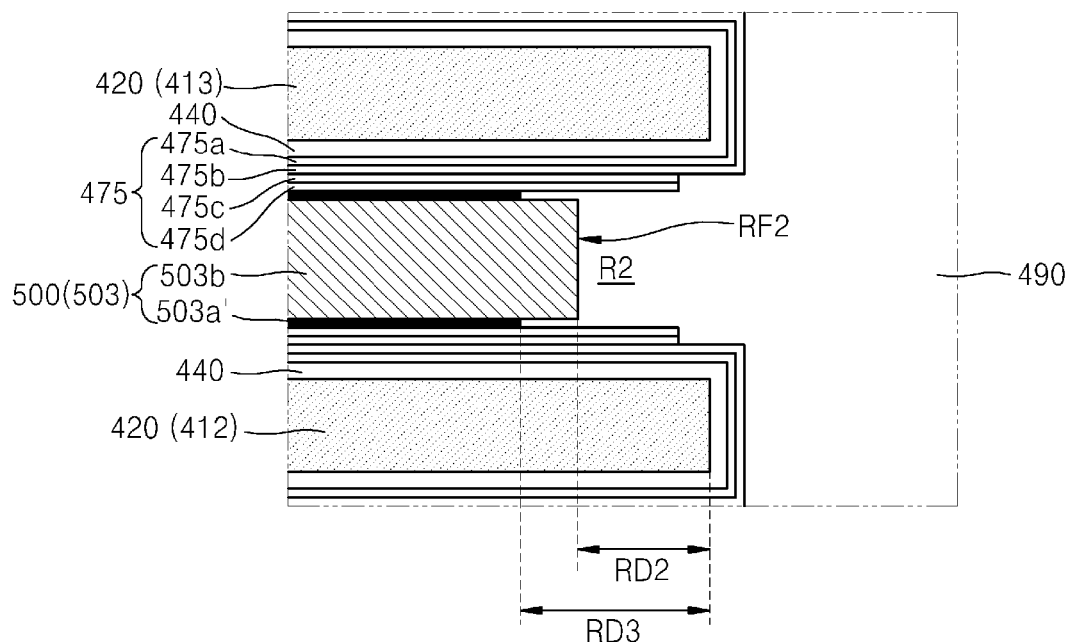
Figure 19:
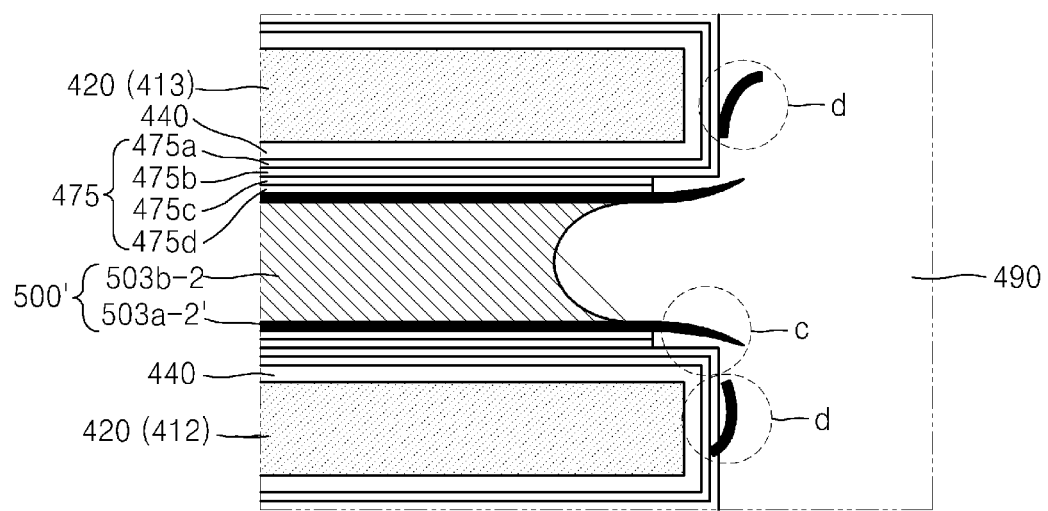
FIG. 19 is a cross-sectional view of a comparative example for comparison with FIGS. 15 through 18.

FIGS. 15 through 18 are cross-sectional views illustrating a process of forming a gate pattern 500 according to an example embodiment of inventive concepts, and FIG. 19 is a cross-sectional view of a comparative example for comparison with FIGS. 15 through 18.

Figure 15:
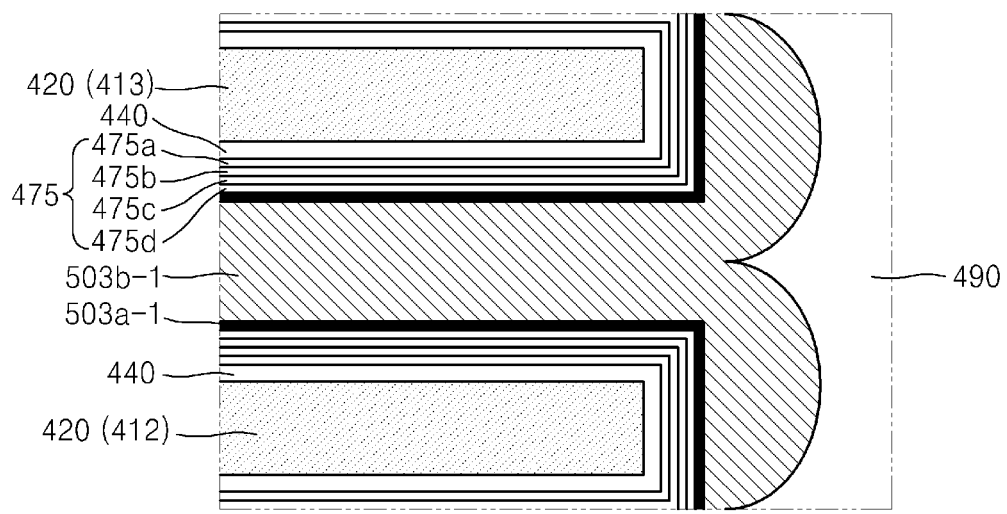
FIGS. 15 through 18 are cross-sectional views illustrating an process of forming a gate pattern according to an example embodiment of inventive concepts.

Referring to FIG. 15, a barrier layer 503a-1 is formed on the storage structure 475 in the rib groove 470 as illustrated in FIG. 10. The barrier layer 503a-1 is formed along a surface of the storage structure 475. A conductive layer 503b-1 that fills the second opening 467 is formed on the barrier layer 503a-1. The conductive layer 503b-1 is formed on the barrier layer 503a-1 to fill the second opening 467.

Figure 16:
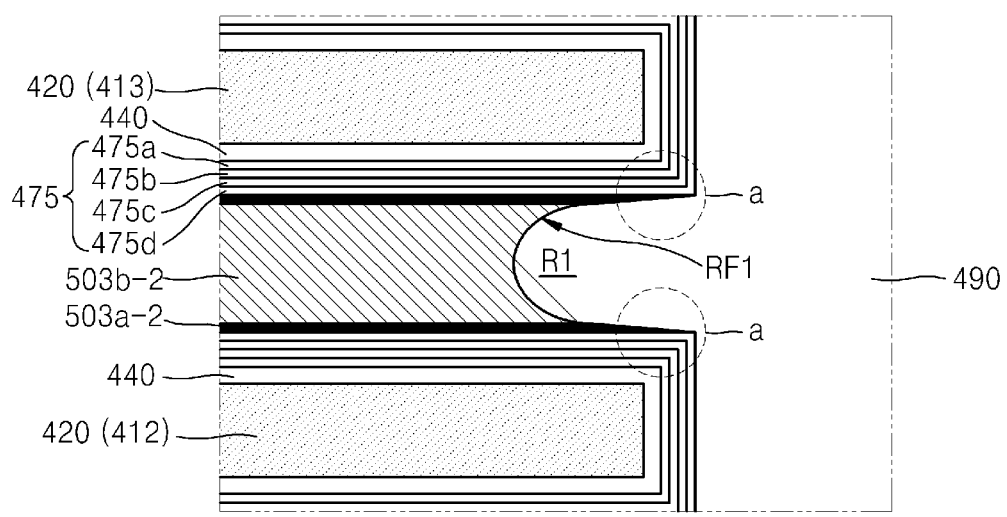

Referring to FIG. 16, the barrier layer 503a-1 and the conductive layer 503b-1 are etched the first time in a first etching process to recess the same in a direction from the side wall of the interlayer insulating layer patterns 420 to the semiconductor layer 465 as denoted by a reference numeral R1. When etching the barrier layer 503a-1 and the conductive layer 503b-1 the first time, etching may be performed using, for example, a wet etchant such as a mixture etchant including a phosphoric acid, a nitric acid, an acetic acid, and deionized water. For example, an etching selectivity of the barrier layer 503a-1 with respect to the conductive layer 503b-1 in the first etching process may be adjusted to be about 0.4 to 0.9.

In the first etching process, a barrier layer 503a-2 and a conductive layer 503b-2 that are recessed the first time are formed. A recessed surface RF1 of the barrier layer 503a-2 and the conductive layer 503b-2 may have a round shape in the rib groove 470. Also, by etching the barrier layer 503a-1 and the conductive layer 503b-1 in the first process, the barrier layer 503a-2 having a small thickness as marked by a in FIG. 16 may be formed on an outer portion of the rib groove 470.

Referring to FIG. 17, according to necessity, some of the blocking insulating layer 475d among the blocking insulating layers 475c and 475d formed on the outer portion of the rib groove 470 is etched even after etching the first recess. By etching a portion of the blocking insulating layer 475d, as marked by b, the barrier layer 503a-2 formed in the rib groove 470 may be easily etched.

In addition, as illustrated in FIGS. 4B and 18, the barrier layer 503a-2 and the conductive layer 503b-2 that are recessed once are etched the second time in a second etching process. Accordingly, the barrier layer 503a-2 and the conductive layer 503b-2 are recessed the second time in a direction from the side wall of the interlayer insulating layer patterns 420 to the semiconductor layer 465 as denoted by a reference numeral R2. When etching the barrier layer 503a-2 and the conductive layer 503b-2 the second time, they may be etched using a wet etchant such as a mixture etchant including, for example, a sulfuric acid, peroxide, and deionized water.

The second etching process is performed by adjusting an etching selectivity between the conductive layer 503b-2 that is recessed before and the barrier layer 503a-2 but by increasing an etching speed of the barrier layer 503a-2. For example, an etching selectivity of the barrier layer 503a-2 with respect to the conductive layer 503b-2 recessed in the first etching process may be adjusted to be about 6 to 10. Accordingly, a recessed barrier layer pattern 503a and a recessed conductive layer pattern 503b that are recessed without a tail of a barrier layer or a bridge, which will be described later, may be formed. Also, by performing the second etching process, the blocking insulating layers 475c and 475d may be recessed in a direction from the side wall of the insulating layer patterns 420 to the semiconductor layer 465.

As illustrated in FIG. 4B, the barrier layer pattern 503a and the conductive layer pattern 503b are recessed at the same recess depths RD2 in a direction from the side wall of the insulating layer patterns 420 to the semiconductor layer 465. According to another embodiment, as illustrated in FIG. 18, when an etching selectivity between the barrier layer pattern 503a and the conductive layer pattern 503b is adjusted, a recess depth RD3 of a barrier layer pattern 503a' may be increased to be greater than the recess depth RD2 of the conductive layer pattern 503b in a direction from the side wall of the insulating layer patterns 420 to the semiconductor layer 465.

A gate pattern 500 including the barrier layer pattern 503a and the conductive layer pattern 503b is formed in the second etching process. A recessed surface RF2 of the barrier layer pattern 503a and the conductive layer pattern 503b, that is, a recessed surface RF2 of the gate pattern 500, is formed to be vertical to the surface of the substrate 400.

Here, the method of manufacturing a gate pattern described with reference to FIGS. 15 through 18 will be compared with the comparative example illustrated in FIG. 19.

In detail, after performing the processes of FIGS. 15 through 17, if the second etching process is not performed, in the barrier layer 503a-2 and the conductive layer 503b-2 that are recessed once, a barrier layer tail as marked by d may be formed on an outer portion of the rib groove 475 in a subsequent process, for example, through an etching process of the blocking insulating layers 475c and 475d. The barrier layer tail functions as a bridge source between gate patterns 500' as marked by d and thereby decreases device reliability.

On the other hand, according to the embodiments of inventive concepts, by performing an etching process twice, the gate pattern 500 is recessed in a direction from the side wall of the interlayer insulating layer patterns 420 to the semiconductor layer 465. Thus, according to example embodiments of inventive concepts, formation of bridges between the gate patterns 500 may be reduced (and/or prevented).

Figure 13:
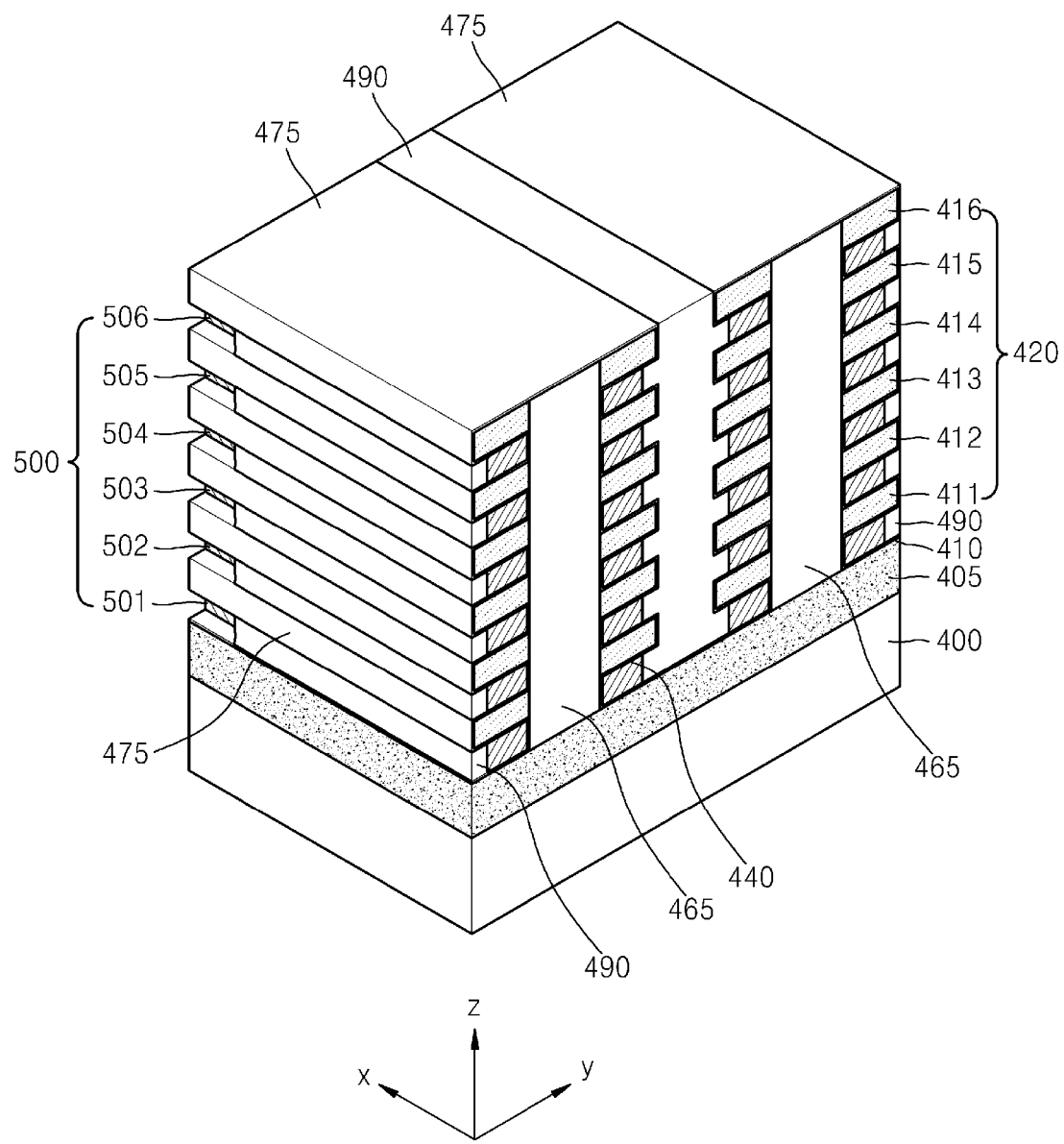
Figure 14:
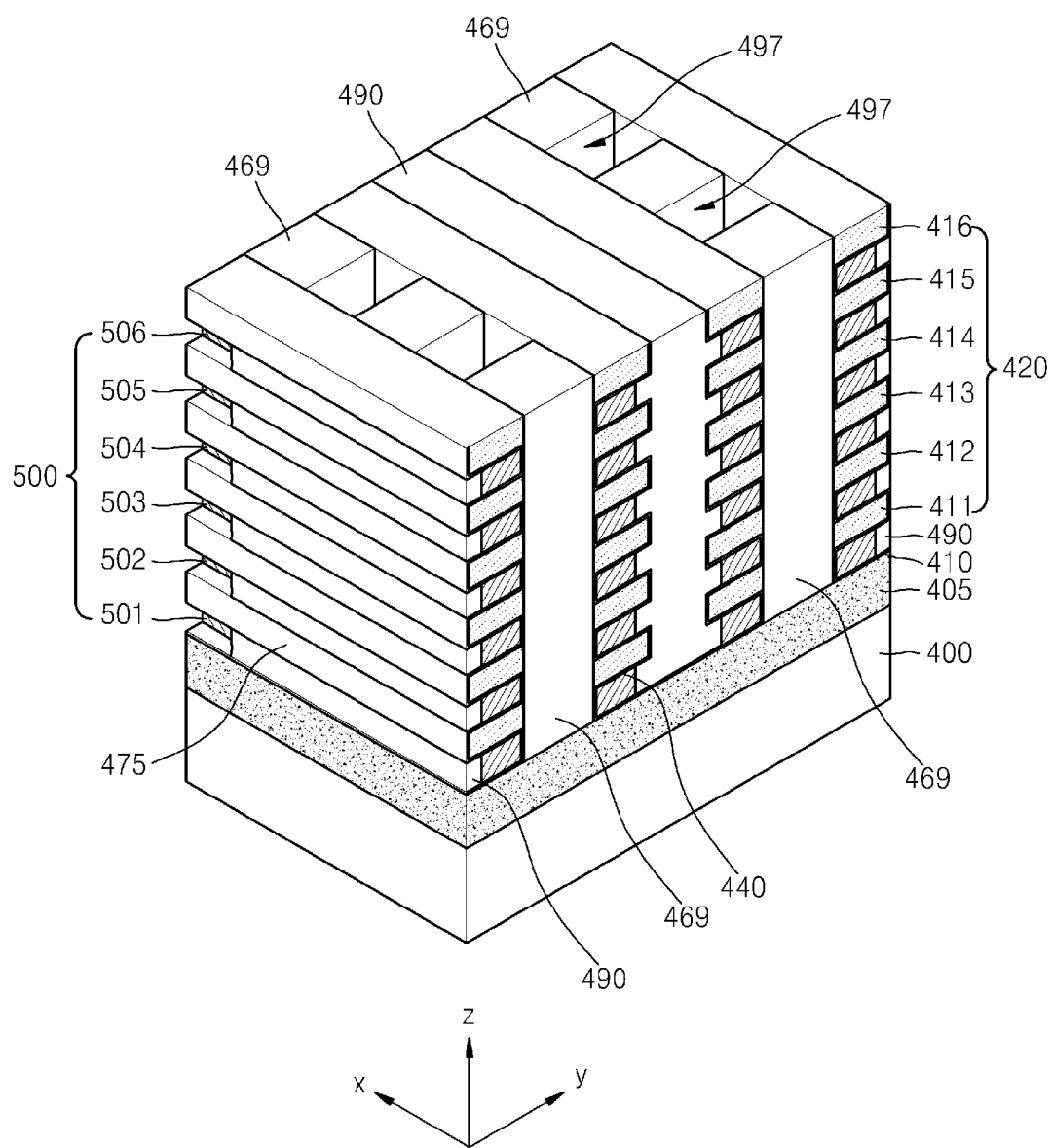

Referring to FIGS. 13 and 14, a silicon oxide layer is deposited in a third opening 485 to form an isolation insulating layer 490. Then, a fourth photoresist pattern (not shown) is formed on the interlayer insulating material layer 416 in the uppermost portion and on an upper surface of the device isolation layer 490. The fourth photoresist pattern is formed to expose a portion of the semiconductor layer 465.

A fourth opening 497 exposing the substrate 400 is formed by etching the semiconductor layer 465 so as to expose a surface of the substrate 400 by using the fourth photoresist pattern as an etching mask. Accordingly, as a portion of the semiconductor layer 465 is removed, a semiconductor layer pattern 469 having an isolated form in the first direction is formed. The semiconductor layer pattern 469 has a pillar shape or a cylinder shape. In addition, transistors are formed only on side walls of the semiconductor layer pattern 469 having a cylinder shape in a vertical direction.

Further, as illustrated in FIG. 3, the bit line 510 that connects the semiconductor layer patterns 469 repeatedly formed in the first direction is formed on the semiconductor layer pattern 469 in a second direction. By forming the bit line 510 as described above, a non-volatile memory device having a vertical structure is completed.

Figure 20:
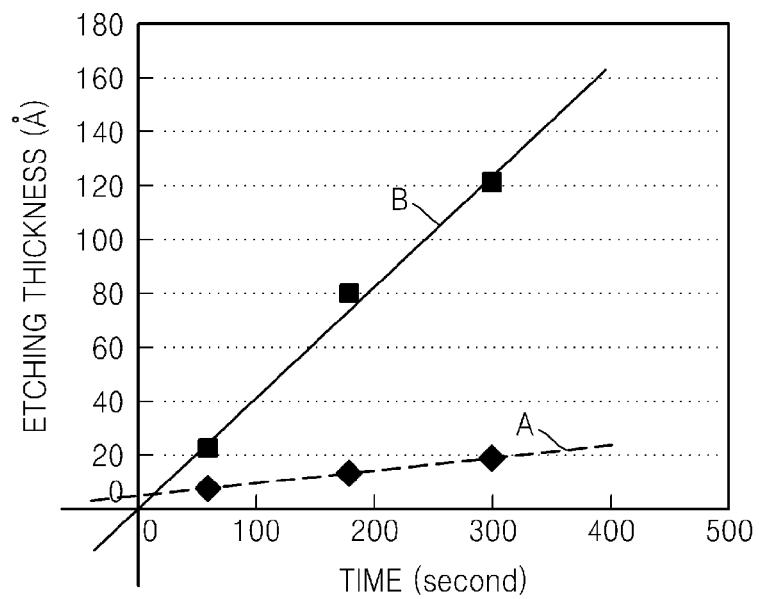
FIG. 20 is a graph for explaining etching speeds of a barrier layer and a conductive layer according to an example embodiment of inventive concepts.

FIG. 20 is a graph for explaining etching speeds of a barrier layer and a conductive layer according to an example embodiment of inventive concepts.

In detail, etching thicknesses of a barrier layer and a conductive layer according to time are shown in an example embodiment of inventive concepts. The etchant used in the second etching process described above may be used here. A reference numeral a indicates an etching speed of a conductive layer, for example, tungsten, and a reference numeral b indicates an etching speed of a barrier layer, for example, a titanium nitride layer.

As can be seen from FIG. 20, the etching speed of the barrier layer B may be faster than that of the conductive layer A. Accordingly, the barrier layer tail formed during the second etching process may be removed.

Figure 21:
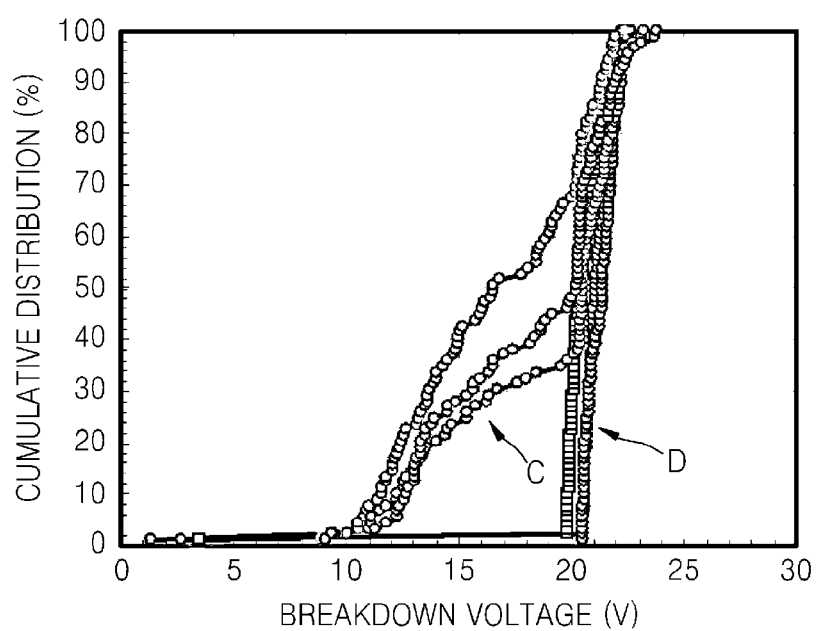
FIG. 21 illustrates a breakdown voltage of a non-volatile memory device according to an example embodiment of inventive concepts.

FIG. 21 illustrates a breakdown voltage of a non-volatile memory device according to an example embodiment of inventive concepts.

In detail, a reference numeral C denotes a non-volatile memory device in which a barrier layer tail or bridges are formed according to a comparative example, and a reference numeral D denotes a non-volatile memory device having a recessed gate pattern, from which a barrier layer tail or a bridge is removed according to an example embodiment of inventive concepts.

As can be seen from FIG. 21, a breakdown voltage of the non-volatile memory device according to an example embodiment of inventive concepts has improved cumulative distribution compared to the comparative example.

Hereinafter, only a portion of an application example of the non-volatile memory device having a vertical structure according to an example embodiment of inventive concepts will be described. The application example is not restrictive, and one having ordinary skill in the art would appreciate that a non-volatile memory device according to other example embodiments of inventive concepts may be used in other various manners.

Figure 22:
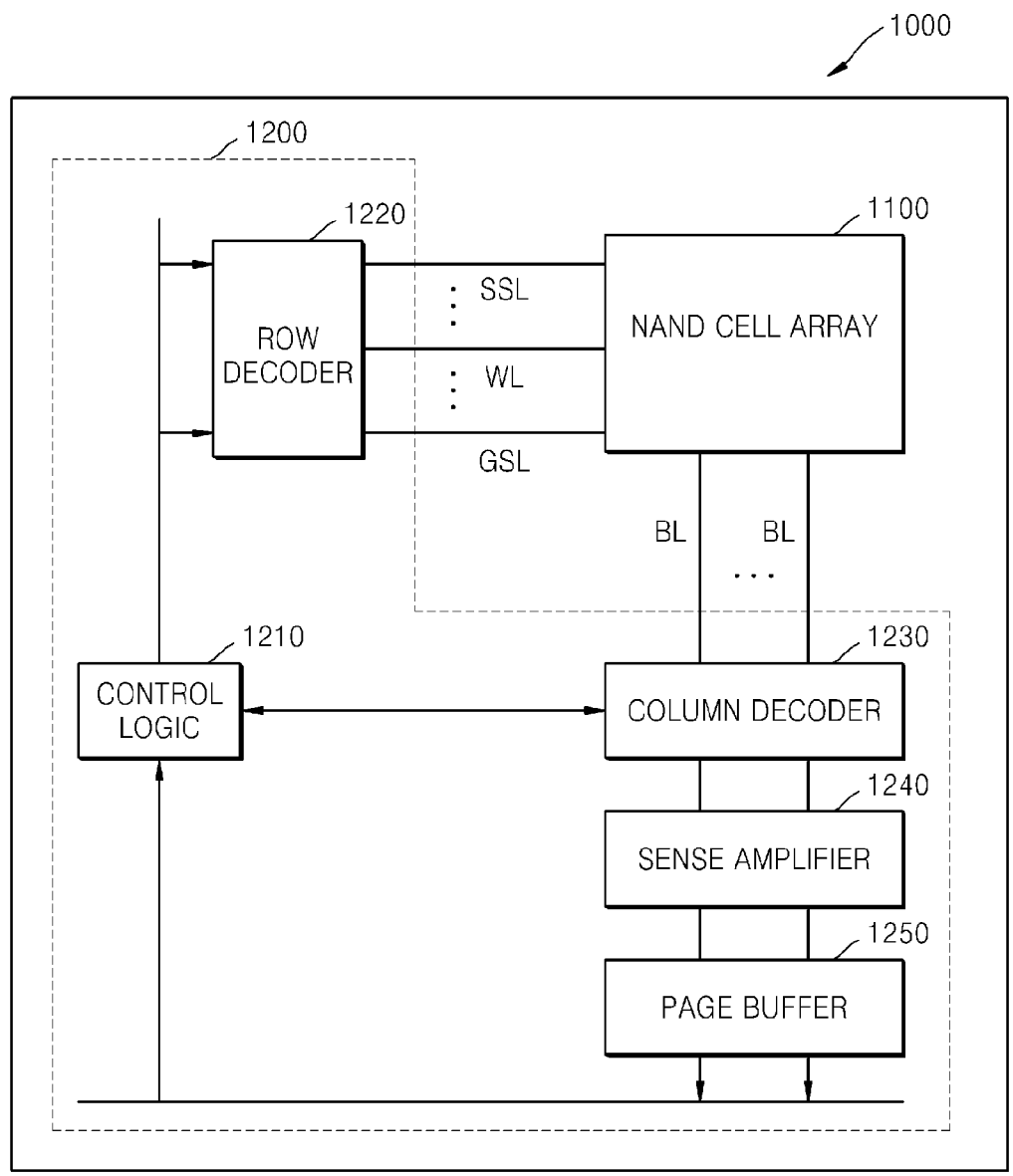
FIG. 22 is a schematic block diagram illustrating a non-volatile memory device having a vertical structure according to an example embodiment of inventive concepts.

FIG. 22 is a schematic block diagram illustrating a non-volatile memory device 1000 having a vertical structure according to an example embodiment of inventive concepts.

Referring to FIG. 22, a NAND cell array 1100 may be coupled to a core circuit unit 1200. For example, a NAND cell array 1100 may include a non-volatile memory device having a vertical structure as described above. The core circuit unit 1200 may include a control logic 1210, a row decoder 1220, a column decoder 1230, a sense amplifier 1240 and/or a page buffer 1250.

The control logic 1210 may perform communication with the row decoder 1220, the column decoder 1230 and/or the page buffer 1250. The row decoder 1220 may perform communication with the NAND cell array 1100 having a stacking structure via the string selecting lines SSL, the word lines WL, and/or the ground selecting lines GSL. The column decoder 1230 may perform communication with the NAND cell array 1100 via the bit lines BL. The sense amplifier 1240 may be connected to the column decoder 1230 when a signal is output from the NAND cell array 1100, and may not be connected to the column decoder 1230 when a signal is transmitted to the NAND cell array 1100.

For example, the control logic 1210 may transmit a low address signal to the row decoder 1220, and the row decoder 1220 may decode the low address signal and transmit the same to the NAND cell array 1100 via the string selecting lines SSL, the word lines WL, and the ground selecting lines GSL. The control logic 1210 may transmit a column address signal to the column decoder 1230 or the page buffer 1250, and the column decoder 1230 may decode the column address signal and transmit the same to the NAND cell array 1100 via the bit lines BL. A signal of the stacked type NAND cell array 1100 may be transmitted to the sense amplifier 1240 via the column decoders 1230, and may be amplified there and pass through the page buffer 1250 and be transmitted to the control logic 1210.

Figure 23:
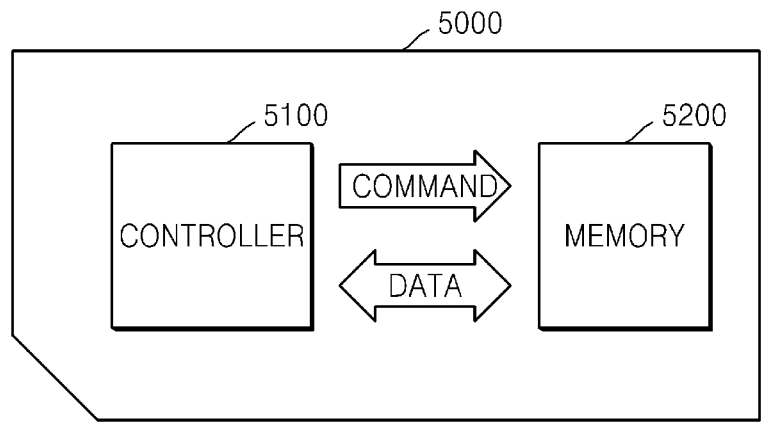
FIG. 23 is a schematic view illustrating a card according to an example embodiment of inventive concepts.

FIG. 23 is a schematic view illustrating a card 5000 according to an example embodiment of inventive concepts.

Referring to FIG. 23, a controller 5100 and a memory 5200 may be arranged to exchange electrical signals. For example, when the controller 5100 gives a direction, the memory 5200 may transmit data. The memory 5200 may include a non-volatile memory device according to one of the example embodiments of inventive concepts. The non-volatile memory devices according to one of the example embodiments of inventive concepts may be arranged in a NAND or NOR architecture memory array (not shown) according to a corresponding logic gate design. A memory array arranged in a plurality of rows and columns may form at least one memory array bank (not shown). The memory 5200 may include a memory array (not shown) or a memory array bank (not shown) as described above. Also, in order to drive the above-described memory array bank (not shown), the card 500 may further include a row decoder (not shown), a column decoder (not shown), I/O buffers (not shown), and/or a control register (not shown). The card 5000 may be used in memory devices such as various types of cards, for example, memory stick card, a smart media card (SM), a secure digital (SD) card, mini SD card, or a multi-media card (MMC).

Figure 24:
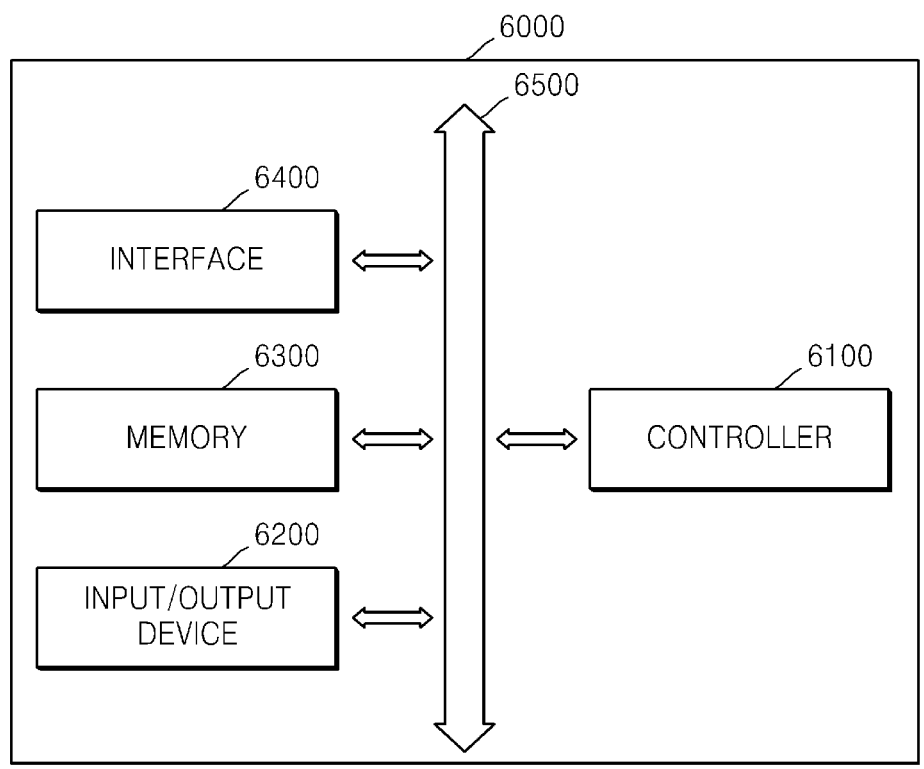
FIG. 24 is a schematic view of a system according to an example embodiment of inventive concepts.

FIG. 24 is a schematic view of a system 6000 according to an example embodiment of inventive concepts.

Referring to FIG. 24, the system 6000 may include a controller 6100, an input/output device 6200, a memory 6300, and an interface 6400. The system 6000 may be a mobile system or a system that transmits or receives information. The mobile system may be a personal digital assistant (PDA), a portable computer, a web tablet, a wireless phone, a mobile phone, a digital music player, or a memory card. The controller 6100 may execute a program and control the system 6000. The controller 6100 may be, for example, a microprocessor, a digital signal processor, a microcontroller, or a similar device thereto. The input/output device 6200 may be used to input or output data of the system 6000. The system 6000 may be connected to an external device such as a personal computer or a network via the input/output device 6200 so as to exchange data with the external device. The input/output device 6200 may be, for example, a keypad, a keyboard, or a display device. The memory 6300 may storage codes and/or data for driving the controller 6100 and/or data processed by using the controller 6100. The memory 6300 may include a non-volatile memory device according to one of the embodiments of inventive concepts. The interface 6400 may be a data transmission path between the system 6000 and other external devices. The controller 6100, the input/output device 6200, the memory 6300, and the interface 6400 may communicate with one another via a bus 6500. For example, the system 6000 may be used in a mobile phone, a MP3 player, a navigation device, a portable multimedia player (PMP), a solid state disk (SSD), or household appliances.

While some example embodiment of inventive concepts have been particularly shown and described, it will be understood that various changes in form and details may be made therein without departing from the spirit and scope of the following claims.

What is claimed is:

1. A method of manufacturing a non-volatile memory device having a vertical structure, the method comprising:
   stacking a plurality of sacrificial layers and a plurality of interlayer insulating layers alternately on a substrate;
   forming a stacking structure by etching a first portion of the plurality of sacrificial layers and the interlayer insulating layers to form a plurality of sacrificial layer patterns and a plurality of interlayer insulating layer patterns,
   the plurality of sacrificial layer patterns and the plurality of interlayer insulating layer patterns defining first openings in the stacking structure that expose an upper portion of the substrate;
   forming semiconductor layer patterns in the first openings of the stacking structure;
   etching a second portion of the stacking structure to define a second opening in the stacking structure that is between the semiconductor layer patterns;
   etching the plurality of sacrificial layer patterns to define a plurality of rib grooves;
   forming a storage structure on the semiconductor layer patterns in the plurality of rib grooves, the storage structure including at least one blocking insulating layer recessed a first distance in a direction from a sidewall defined by the plurality of interlayer insulating layer patterns to the semiconductor layer patterns; and forming a plurality of gate patterns on the semiconductor layer patterns in the plurality of rib grooves, the plurality of gate patterns being recessed a second distance in the direction from the side-wall defined by the plurality of interlayer insulating layer patterns to the semiconductor layer patterns, the second distance being greater than the first distance.

2. The method of claim 1, wherein a recessed surface of the plurality of gate patterns is vertical to a surface of the substrate.

3. The method of claim 1, wherein the forming the plurality of gate patterns comprises:
    forming a barrier layer on the storage structure in the plurality of rib grooves;
    forming a conductive layer that fills the plurality rib grooves on the barrier layer;
    recessing the conductive layer and the barrier layer into the plurality of rib grooves by etching the conductive layer and the barrier layer in a first etching process; and
    forming a conductive layer pattern and a barrier layer pattern by etching the recessed conductive layer and the recessed barrier layer to recess the conductive layer and barrier layer into the rib grooves in a second etching process.

4. The method of claim 3, wherein in the second etching process, a recessed surface of the gate pattern is formed to be vertical to a surface of the substrate.

5. The method of claim 3, wherein in the second etching process, the barrier layer pattern and the conductive layer pattern are recessed at different recess depths in the direction from the sidewall defined by the plurality of interlayer insulating layer patterns to the semiconductor layer patterns.

6. The method of claim 3, wherein the second etching process is performed while adjusting an etching selectivity between the recessed conductive layer and the recessed barrier layer but increasing an etching speed of the barrier layer.

7. The method of claim 3, wherein
    the at least one blocking insulating layer is one blocking insulating layer,
    the storage structure includes a tunnel insulating layer, a charge storage layer, and the blocking insulating layer disposed sequentially from a side-wall defined by the semiconductor layer pattern, and
    the storage structure is continuously extended between the plurality of interlayer insulating layer patterns and the plurality of gate patterns along the plurality of gate patterns.

8. The method of claim 7, wherein the second etching process includes recessing the blocking insulating layer in the direction from the side-wall defined by the plurality of interlayer insulating layer patterns to the semiconductor layer patterns.

9. The method of claim 7, further comprising:
    etching the blocking insulating layer after performing the first etching process.

10. A method of manufacturing a non-volatile memory device having a vertical structure, the method comprising:
    stacking a plurality of sacrificial layers and a plurality of interlayer insulating layers alternately on a substrate;
    forming a stacking structure by etching a first portion of the plurality of sacrificial layers and the interlayer insulating layers to form a plurality of sacrificial layer patterns and a plurality of interlayer insulating layer patterns, the plurality of sacrificial layer patterns and the plurality of interlayer insulating layer patterns defining first openings in the stacking structure that expose an upper portion of the substrate;
    forming semiconductor layer patterns in the first openings of the stacking structure;
    etching a second portion of the stacking structure to define a second opening in the stacking structure that is between the semiconductor layer patterns;
    etching the plurality of sacrificial layer patterns to define a plurality of rib grooves;
    forming a storage structure on the semiconductor layer patterns in the plurality of rib grooves; and
    forming a plurality of gate patterns on the semiconductor layer patterns in the plurality of rib grooves, the plurality of gate patterns being recessed in a direction from a sidewall defined by the plurality of interlayer insulating layer patterns to the semiconductor layer patterns,
    the forming the plurality of gate patterns including,
        forming a barrier layer on the storage structure in the plurality of rib grooves,
        forming a conductive layer that fills the plurality rib grooves on the barrier layer,
        recessing the conductive layer and the barrier layer into the plurality of rib grooves by etching the conductive layer and the barrier layer in a first etching process, and
        forming a conductive layer pattern and a barrier layer pattern by etching the recessed conductive layer and the recessed barrier layer to recess the conductive layer and barrier layer into the rib grooves in a second etching process.

11. The method of claim 10, wherein in the second etching process, a recessed surface of the gate pattern is formed to be vertical to a surface of the substrate.

12. The method of claim 10, wherein in the second etching process, the barrier layer pattern and the conductive layer pattern are recessed at different recess depths in the direction from the side-wall defined by the plurality of interlayer insulating layer patterns to the semiconductor layer patterns.

13. The method of claim 10, wherein the second etching process is performed while adjusting an etching selectivity between the recessed conductive layer and the recessed barrier layer but increasing an etching speed of the barrier layer.

14. The method of claim 10, wherein
    the storage structure includes a tunnel insulating layer, a charge storage layer, and a blocking insulating layer disposed sequentially from a side-wall defined by the semiconductor layer pattern, and
    the storage structure is continuously extended between the plurality of interlayer insulating layer patterns and the plurality of gate patterns along the plurality of gate patterns.

15. The method of claim 14, wherein the second etching process includes recessing the blocking insulating layer in the direction from the side-wall defined by the plurality of interlayer insulating layer patterns to the semiconductor layer patterns.

16. The method of claim 14, further comprising:
    etching the blocking insulating layer after performing the first etching process.

17. A method of manufacturing a non-volatile memory device comprising:
    forming at least one stacked structure on a substrate, each stacked structure including,
        a semiconductor layer extending vertically on the substrate, a plurality of interlayer insulating layers extending a first distance from at least one sidewall defined by the semiconductor layer, the plurality of interlayer insulating layers being spaced apart to define grooves that expose a part of the at least one sidewall defined by the semiconductor layer, a storage layer in the grooves defined by the plurality of interlayer insulating layers, the storage layer including a blocking insulating layer recessed a first length in a direction from a sidewall defined by the plurality of interlayer insulating layers to the semiconductor layer, and a plurality of gate electrodes contacting the storage layer in the grooves defined by the plurality of interlayer insulating layers, the plurality of gate electrodes extending a second distance from the at least one sidewall defined by the semiconductor layer, the second distance being less than the first distance, the plurality of gate electrodes being recessed a second length in the direction from the sidewall defined by the plurality of interlayer insulating layers to the semiconductor layer, the second length being greater than the first length; and forming a bit line on the at least one stacked structure.

18. The method of claim 17, wherein the forming at least one stacked structure includes forming the plurality of gate electrodes by, forming a barrier layer over the storage layer in the grooves defined by the plurality of interlayer insulating layers, forming a conductive layer on the barrier layer that fills the grooves defined by the plurality of interlayer insulating layers, and recessing at least one of the conductive layer and the barrier layer to extend the second distance from the at least one sidewall defined by the semiconductor layer.

19. The method of claim 18, wherein the storage structure includes a tunnel insulating layer, a charge storage layer, and the blocking insulating layer between the plurality of interlayer insulating layers and the barrier layer, and the recessing at least one of the conductive layer and the barrier layer includes, performing a first etching process to partially remove the barrier layer and the conductive layer in a direction from the sidewall defined by the plurality of interlayer insulating layers to the semiconductor layer, the first etching process forming a remaining portion of the barrier layer and a remaining portion of the conductive layer, removing a portion of the blocking insulating layer from in between a tail part of the remaining portion of the barrier layer and the plurality of interlayer insulating layer, and performing a second etching process to remove the tail part of the remaining portion of the barrier layer and partially remove the remaining portion of the conductive layer.

20. The method of claim 19, wherein an etching selectivity of the tail part of the remaining portion of the barrier layer with respect to the remaining portion of the conductive layer is about 6 to 10 in the second etching process.

21. The method of claim 17, further comprising:

forming a plurality of the stacked structures that are spaced apart on the substrate, and forming an isolation pattern between the plurality of stacked structures.

* * * * *